(12) United States Patent
Yamamoto et al.

(10) Patent No.: US 12,400,191 B2
(45) Date of Patent: Aug. 26, 2025

(54) INFORMATION PROCESSING APPARATUS, INFORMATION PROCESSING SYSTEM, AND PART ORDERING METHOD

(71) Applicant: Tokyo Electron Limited, Tokyo (JP)

(72) Inventors: Masakazu Yamamoto, Iwate (JP); Tadashi Enomoto, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 396 days.

(21) Appl. No.: 17/553,909

(22) Filed: Dec. 17, 2021

(65) Prior Publication Data
US 2022/0207492 A1 Jun. 30, 2022

(30) Foreign Application Priority Data

Dec. 25, 2020 (JP) ................................. 2020-217801

(51) Int. Cl.
*G06Q 10/20* (2023.01)
*G01M 99/00* (2011.01)
(Continued)

(52) U.S. Cl.
CPC .......... *G06Q 10/20* (2013.01); *G01M 99/008* (2013.01); *G06F 30/20* (2020.01);
(Continued)

(58) Field of Classification Search
CPC ............ G06Q 10/20; G06Q 10/06316; G06Q 10/067; G06Q 10/087; G06Q 50/04;
(Continued)

(56) References Cited

U.S. PATENT DOCUMENTS 6,185,472 B1 *  2/2001  Onga ..................... G06F 30/23
                                                    700/121
8,396,583 B2 *  3/2013  Tsai ........................ H01L 22/20
                                                    702/182
(Continued)

FOREIGN PATENT DOCUMENTS

JP        2003-031456 A      1/2003
JP        2003-086479 A      3/2003
(Continued)

OTHER PUBLICATIONS

Monitoring, maintenance and diagnosis in a computer-integrated environment for semiconductor manufacturing. Chang, Norman H.. ProQuest Dissertations and ThesesProQuest Dissertations Publishing. (1990).*

(Continued)

*Primary Examiner* — Timothy Padot
(74) *Attorney, Agent, or Firm* — Venjuris, P.C.

(57) ABSTRACT

An information processing apparatus executes a simulation of a state of a process which is being performed in a semiconductor manufacturing apparatus, by using a simulation model of the semiconductor manufacturing apparatus. The information processing apparatus includes: a physical sensor data acquisition unit that acquires physical sensor data measured in the semiconductor manufacturing apparatus that is performing the process according to process parameters; a simulation execution unit that executes the simulation by the simulation model according to the process parameters, thereby outputting virtual sensor data; a simulation result determination unit that performs a pre-detection of a part of the semiconductor manufacturing apparatus that needs to be replaced, based on a difference between the physical sensor data and the virtual sensor data; and a part (Continued)

order unit that orders the part of the semiconductor manufacturing apparatus based on a result of the pre-detection.

11 Claims, 16 Drawing Sheets

(51) Int. Cl.
    *G06F 30/20*    (2020.01)
    *G06Q 10/0631*  (2023.01)
    *G06Q 10/067*   (2023.01)
    *G06Q 10/087*   (2023.01)
    *G06Q 50/04*    (2012.01)

(52) U.S. Cl.
    CPC ..... *G06Q 10/06316* (2013.01); *G06Q 10/067* (2013.01); *G06Q 10/087* (2013.01); *G06Q 50/04* (2013.01)

(58) Field of Classification Search
    CPC .......... G06F 30/20; G05B 2219/31444; G05B 2219/32236; G05B 2219/45031; G05B 19/41885; G05B 23/0205; H01L 21/00
    See application file for complete search history.

(56)                References Cited

U.S. PATENT DOCUMENTS

| | | | |
|---|---|---|---|
| 2005/0071034 A1* | 3/2005 | Mitrovic | G06F 30/20 700/121 |
| 2005/0071035 A1* | 3/2005 | Strang | G05B 19/41885 700/121 |
| 2009/0228408 A1* | 9/2009 | Kaushal | G06N 5/04 714/26 |
| 2016/0033962 A1* | 2/2016 | Cote | G05B 19/41885 700/29 |
| 2019/0012847 A1* | 1/2019 | Fukuda | H01L 21/67288 |

FOREIGN PATENT DOCUMENTS

| | | |
|---|---|---|
| JP | 2003-173379 A | 6/2003 |
| JP | 2018-125451 A | 8/2018 |

OTHER PUBLICATIONS

Predictive modeling for intelligent maintenance in complex semiconductor manufacturing processes. Liu, Yang. ProQuest Dissertations and ThesesProQuest Dissertations Publishing. (2008).*

G. Nadoli and D. Pillai, "Simulation in automated material handling systems design for semiconductor manufacturing," Proceedings of Winter Simulation Conference, Lake Buena Vista, FL, USA, 1994, pp. 892-899.*

D. A. Hodges, L. A. Rowe and C. J. Spanos, "Computer integrated manufacturing (semiconductor processing)," Proceedings. Seventh IEEE/CHMT International Electronic Manufacturing Technology Symposium,, San Francisco, CA, USA, 1989, pp. 1-3.*

* cited by examiner

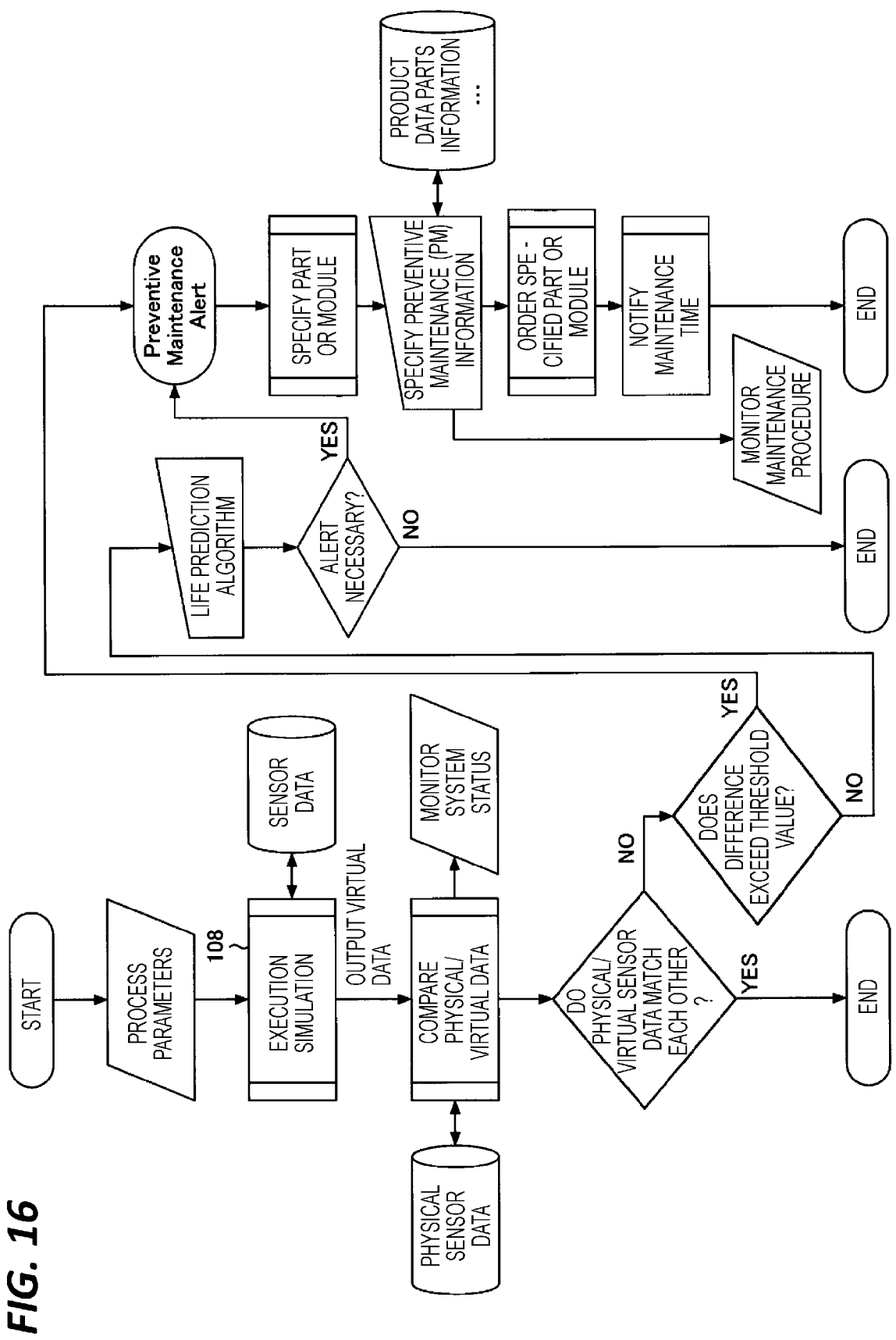

INFORMATION PROCESSING APPARATUS, INFORMATION PROCESSING SYSTEM, AND PART ORDERING METHOD

CROSS-REFERENCE TO RELATED APPLICATIONS

This application is based on and claims priority from Japanese Patent Application No. 2020-217801, filed on Dec. 25, 2020, with the Japan Patent Office, the disclosure of which is incorporated herein in its entirety by reference.

TECHNICAL FIELD

The present disclosure relates to an information processing apparatus, an information processing system, and a part ordering method.

BACKGROUND

A process simulation is used in the field of manufacturing or researching/developing semiconductor products. The process simulation may handle various physical phenomena related to a semiconductor process (hereinafter, referred to as a "process") by using a physical model (simulation model) (see, e.g., Japanese Patent Laid-Open Publication No. 2018-125451).

Further, for example, in a currently operating semiconductor manufacturing apparatus, the replacement of parts that need to be replaced due to the end of life or an occurrence of a failure is performed by conducting a maintenance.

SUMMARY

An aspect of the present disclosure provides an information processing apparatus that executes a simulation of a state of a process which is being performed in a semiconductor manufacturing apparatus, by using a simulation model of the semiconductor manufacturing apparatus. The information processing apparatus includes: a physical sensor data acquisition unit configured to acquire physical sensor data measured in the semiconductor manufacturing apparatus that is performing the process according to process parameters; a simulation execution unit configured to execute the simulation by the simulation model according to the process parameters, thereby outputting virtual sensor data; a simulation result determination unit configured to perform a pre-detection of a part of the semiconductor manufacturing apparatus that needs to be replaced, based on a difference between the physical sensor data and the virtual sensor data; and a part order unit configured to order the part of the semiconductor manufacturing apparatus based on a result of the pre-detection.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 16 is a diagram illustrating an example of a maintenance time pre-detecting process and a part ordering process.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the drawings.

<System Configuration>

Figure 1:
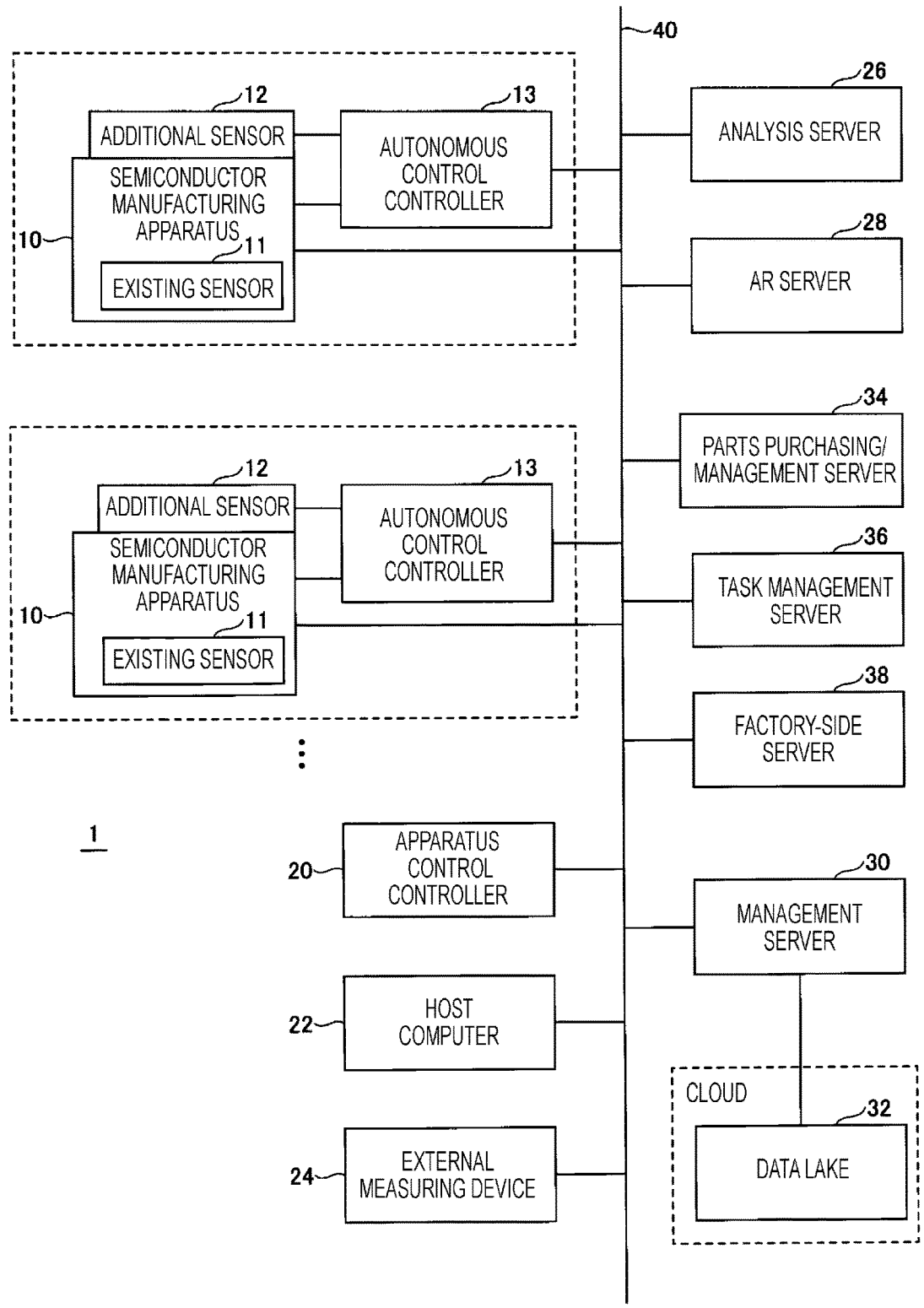
FIG. 1 is a configuration diagram of an example of an information processing system according to an embodiment of the present disclosure.

FIG. 1 is a configuration diagram of an example of an information processing system according to an embodiment of the present disclosure. As illustrated in FIG. 1, an information processing system 1 includes a semiconductor manufacturing apparatus 10, existing sensors 11, an additional sensor 12, an autonomous control controller 13, an apparatus control controller 20, a host computer 22, an external measuring device 24, an analysis server 26, an AR server 28, a management server 30, and a data lake 32. Further, the information processing system 1 includes a parts purchasing/management server 34, a task management server 36, and a factory-side server 38.

The semiconductor manufacturing apparatus 10, the autonomous control controller 13, the apparatus control controller 20, the host computer 22, and the external measuring device 24 are connected to each other for a communication through a network 40 such as a local area network (LAN). Further, the analysis server 26, the AR server 28, the management server 30, the parts purchasing/management server 34, the task management server 36, and the factory-side server 38 are connected to each other for a communication through the network 40.

The semiconductor manufacturing apparatus 10 is, for example, a thermal processing film forming apparatus, and performs a process according to a control command (process parameters) output from the apparatus control controller 20. The semiconductor manufacturing apparatus 10 is equipped with a plurality of existing sensors 11. Each existing sensor 11 is an example of a physical sensor that measures, for example, a temperature and a pressure as physical sensor data.

The additional sensor 12 is an example of a physical sensor equipped to verify the reliability of virtual sensor data to be described later. The virtual sensor data are calculated based on a simulation model (physical model) to be described later. Since the additional sensor 12 is provided to verify the reliability of the virtual sensor data calculated based on the simulation model, the additional sensor 12 may not be provided in a finished product to be shipped to customers. The additional sensor 12 measures, for example, a temperature and a pressure as physical sensor data.

The autonomous control controller 13 autonomously controls the semiconductor manufacturing apparatus 10, and executes, for example, a simulation of the state of a process that is being performed in the semiconductor manufacturing apparatus 10 by using a simulation model, and an optimization of process parameters, as described later. Further, the autonomous control controller 13 performs, for example, a failure pre-detection, a maintenance time pre-detection, a maintenance error detection, a parts ordering, and a maintenance list generation. The autonomous control controller 13 is provided for each semiconductor manufacturing apparatus 10.

By performing the simulation using the simulation model to be described later, the autonomous control controller 13 calculates an adhesion state of a film on a wafer, a temperature of the wafer, and states of a gas, plasma or the like, as results obtained after a process is performed according to process parameters.

The data (virtual data) calculated by executing the simulation using the simulation model to be described later include virtual sensor data and virtual process result data. The virtual sensor data are output from virtual sensors. The virtual process result data are data excluding the virtual sensor data among the data included in the virtual data.

The apparatus control controller 20 has a computer configuration for controlling the semiconductor manufacturing apparatus 10. The apparatus control controller 20 outputs optimized process parameters to be described later, to the semiconductor manufacturing apparatus 10 as process parameters for controlling control parts of the semiconductor manufacturing apparatus 10.

The host computer 22 is an example of a man-machine interface (MMI) that receives an instruction for the semiconductor manufacturing apparatus 10 from an operator, and provides the operator with information about the semiconductor manufacturing apparatus 10.

The external measuring device 24 is a measuring device, such as a film thickness measuring device, a sheet resistance measuring device, or a particle measuring device, which measures results after a process is performed according to process parameters. For example, the external measuring device 24 measures an adhesion state of a film on a wafer such as a monitor wafer. Hereinafter, the data measured by the external measuring device 24 will be referred to as physical process result data.

As described later, the analysis server 26 performs, for example, an update of the simulation model, an analysis of data for optimizing process parameters, and an analysis of data for a failure pre-detection or a maintenance time pre-detection. The AR server 28 uses an AR (augmented reality) technology to display a screen of a simulation result for the state of a process that is being performed in the semiconductor manufacturing apparatus 10, or a screen (contents) for supporting a task such as repair and maintenance.

The management server 30 manages, for example, information on multiple semiconductor manufacturing apparatuses 10 of one or more companies that is stored in a data storage area such as the data lake 32 (e.g., process parameters used when a semiconductor manufacturing apparatus 10 performs a process, and physical sensor data and physical process result data when the process according to the process parameters is performed). By editing a simulation model based on the information on the multiple semiconductor manufacturing apparatuses 10 as described later, a base simulation model may be edited (corrected) based on the operations of the multiple semiconductor manufacturing apparatuses 10. The base simulation model is a model that corresponds to the greatest common divisor based on the multiple semiconductor manufacturing apparatuses 10.

The base simulation model is edited to adapt to each semiconductor manufacturing apparatus 10 through, for example, a deep learning. The editing is performed, for example, every time each semiconductor manufacturing apparatus 10 is operated, so that the prediction accuracy of the simulation model in each semiconductor manufacturing apparatus 10 is improved as the number of the operation times increases.

The parts purchasing/management server 34 receives an ordering of parts (components) from the autonomous control controller 13. Further, the parts purchasing/management server 34 analyzes demands for parts from the autonomous control controller 13. The parts purchasing/management server 34 notifies the factory-side server 38 of the ordering of parts or the demands for parts. The factory-side server 38 performs, for example, an inventory management or a production management of parts in the factory, according to the ordering of parts and the demands for parts from the parts purchasing/management server 34.

The task management server 36 generates a task request form by using a maintenance list acquired from the autonomous control controller 13. The task management server 36 causes an operator to perform a task of a maintenance item necessary for the semiconductor manufacturing apparatus 10, according to the generated task request form. The task management server 36 may support the task of the operator by causing an operation terminal of the operator to display a procedure manual for performing the task of the maintenance item, contents for supporting the task of the maintenance item, and information on tools necessary for the task of the maintenance item. When the operator presses, for example, a task end button of the task request form displayed on the operation terminal, the end of the task of the maintenance item is registered. When the end of the task from the operator is registered, the task management server 36 notifies the autonomous control controller 13 of the maintenance item of the ended task by using a maintenance task end notification.

The information processing system 1 of FIG. 1 is merely an example, and various examples of the system configuration are conceivable according to applications or purposes. The classification of devices in FIG. 1, such as the semiconductor manufacturing apparatus 10, the autonomous control controller 13, the apparatus control controller 20, the host computer 22, the external measuring device 24, the analysis server 26, the AR server 28, the management server 30, the parts purchasing/management server 34, the task management server 36, and the factory-side server 38, is merely an example.

For example, the information processing system 1 may be configured in various forms, such as, for example, an integrated configuration of two or more of the semiconductor manufacturing apparatus 10, the autonomous control controller 13, the apparatus control controller 20, the host computer 22, the external measuring device 24, the analysis server 26, the AR server 28, the management server 30, the parts purchasing/management server 34, and the task management server 36, and the factory-side server 38, or a configuration in which these components are further divided.

Further, the analysis server 26 and the AR server 28 may collectively handle the plurality of semiconductor manufacturing apparatuses 10 as in the information processing system 1 of FIG. 1, or may be provided for each semiconductor manufacturing apparatus 10. The analysis server 26 and the AR server 28 provided for each semiconductor manufacturing apparatus 10 may perform a process specialized for the corresponding semiconductor manufacturing apparatus 10.

<Hardware Configuration>

Figure 2:
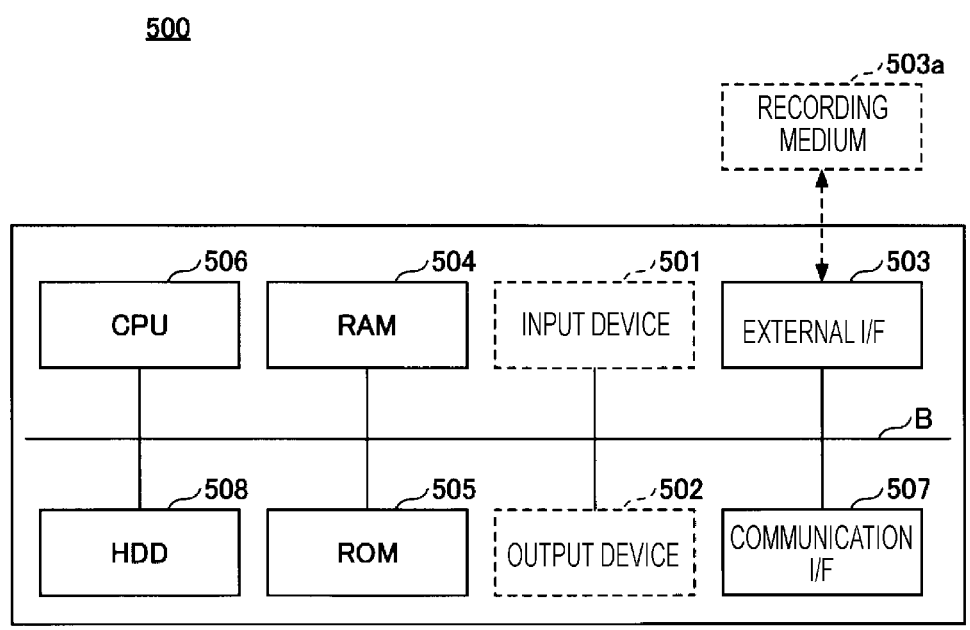
FIG. 2 is a hardware configuration diagram of an example of a computer.

The autonomous control controller 13, the apparatus control controller 20, the host computer 22, the analysis server 26, the AR server 28, the management server 30, the parts purchasing/management server 34, the task management server 36, and the factory-side server 38 of the information processing system 1 are implemented by, for example, a computer having the hardware configuration illustrated in FIG. 2. FIG. 2 is a hardware configuration diagram of an example of the computer.

As illustrated in FIG. 2, a computer 500 includes, for example, an input device 501, an output device 502, an external interface (I/F) 503, a random access memory (RAM) 504, a read only memory (ROM) 505, a central processing unit (CPU) 506, and a communication I/F 507, and a hard disk drive (HDD) 508, which are connected to each other by a bus B. The input device 501 and the output device 502 may be configured to be connected and used when necessary.

The input device 501 is, for example, a keyboard, a mouse, or a touch panel, and is used when an operator or the like inputs each operation signal. The output device 502 is, for example, a display, and displays process results of the computer 500. The communication I/F 507 is an interface for connecting the computer 500 to a network. The HDD 508 is an example of a nonvolatile storage device that stores programs or data.

The external I/F 503 is an interface with an external device. The computer 500 may perform a reading and/or a writing with respect to a recording medium 503a such as a secure digital (SD) memory card, via the external I/F 503. The ROM 505 is an example of a nonvolatile semiconductor memory (storage device) in which programs or data are stored. The RAM 504 is an example of a volatile semiconductor memory (storage device) that temporarily stores programs or data.

The CPU 506 is an arithmetic operation device that reads programs or data from the storage device such as the ROM 505 or the HDD 508 into the RAM 504 and executes a processing, so as to control the entire computer 500 or implement the functions of the computer 500.

The autonomous control controller 13, the apparatus control controller 20, the host computer 22, the analysis server 26, the AR server 28, the management server 30, the parts purchasing/management server 34, the task management server 36, and the factory-side server 38 in FIG. 1 may implement various functions through, for example, the hardware configuration of the computer 500 in FIG. 2.

<Functional Configuration>

Figure 3:
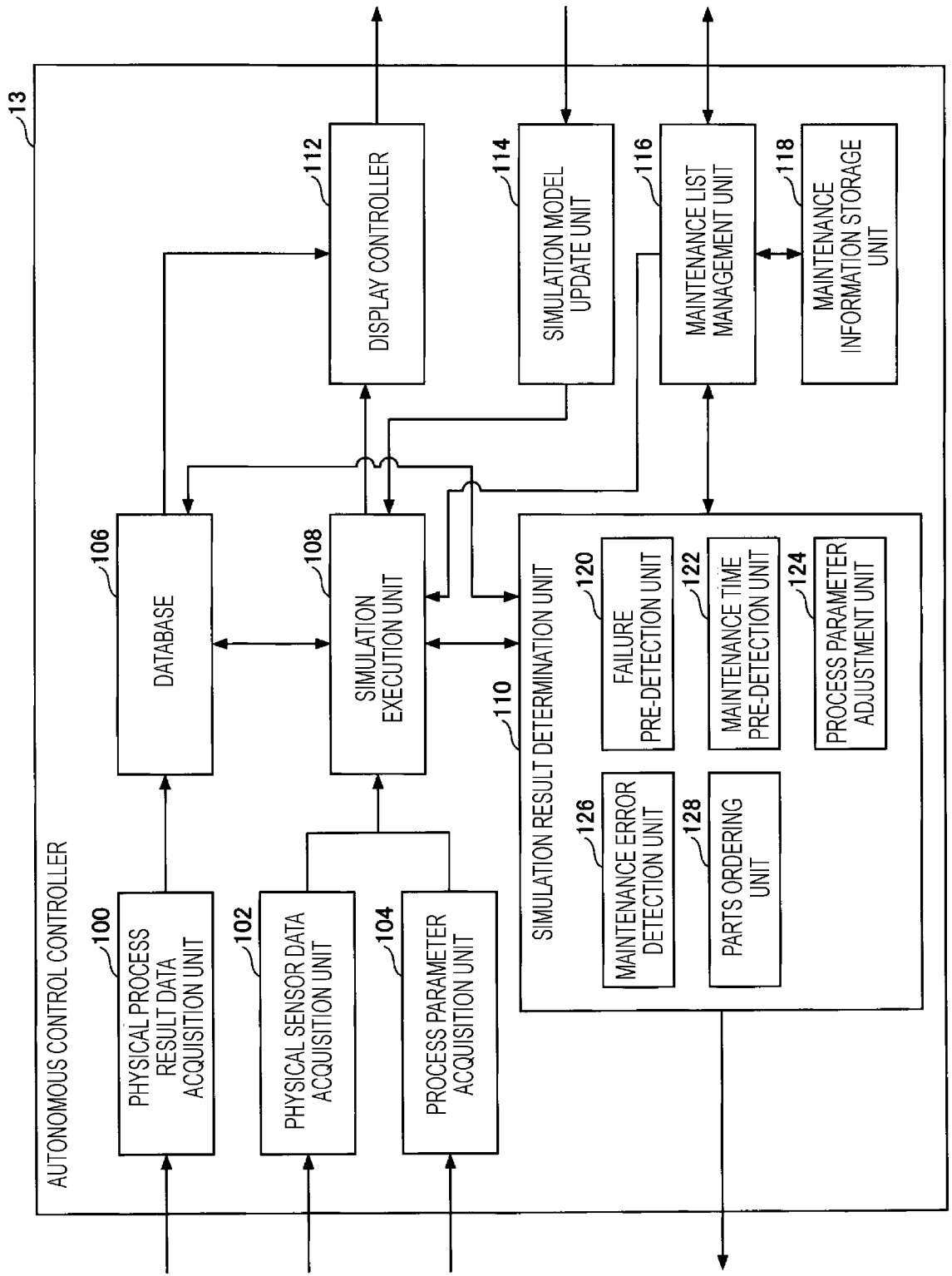
FIG. 3 is a functional block diagram of an example of an autonomous control controller according to the embodiment.

The autonomous control controller 13 of the information processing system 1 according to the present embodiment is implemented by, for example, the functional block of FIG. 3. FIG. 3 is a functional block diagram of an example of the autonomous control controller according to the present embodiment. The functional block diagram of FIG. 3 omits the illustrations of a configuration unnecessary for the description of the present embodiment.

By executing programs for the autonomous control controller 13, the autonomous control controller 13 implements a physical process result data acquisition unit 100, a physical sensor data acquisition unit 102, a process parameter acquisition unit 104, a database 106, a simulation execution unit 108, and a simulation result determination unit 110, a display controller 112, a simulation model update unit 114, a maintenance list management unit 116, and a maintenance information storage unit 118. Further, the simulation result determination unit 110 includes a failure pre-detection unit 120, a maintenance time pre-detection unit 122, a process parameter adjustment unit 124, and a maintenance error detection unit 126, and a parts ordering unit 128.

The physical process result data acquisition unit 100 acquires physical process result data which are results obtained after a process is performed according to process parameters, and stores the acquired data in the database 106.

The physical sensor data acquisition unit 102 acquires the physical sensor data measured by the existing sensors 11 and the additional sensor 12, and provides the acquired data to the simulation execution unit 108. The process parameter acquisition unit 104 acquires the process parameters of the process that is being performed by the semiconductor manufacturing apparatus 10, and provides the acquired process parameters to the simulation execution unit 108. The database 106 is a data storage area that stores data used by the simulation execution unit 108 for executing a simulation, and data used by the analysis server 26 for updating the simulation model or analyzing data.

The simulation execution unit 108 executes the simulation by the simulation model according to the same process parameters as those for the semiconductor manufacturing apparatus 10 that is performing the process, so as to calculate the process state of the semiconductor manufacturing apparatus 10 that is performing the process.

As for the simulation model of the semiconductor manufacturing apparatus 10 that is used by the simulation execution unit 108 for executing a simulation, for example, a simulation model of 1D CAE may be used. The simulation model of 1D CAE expresses the entire semiconductor manufacturing apparatus 10 as a functional base in a functional design which is an upstream design, thereby enabling an evaluation analysis before a structural design (3D CAE).

By using the physical process result data, the physical sensor data, the virtual process result data, and the virtual sensor data for the same process parameters, the simulation result determination unit 110 performs, for example, a failure pre-detection by the failure pre-detection unit 120, a maintenance time pre-detection by the maintenance time pre-detection unit 122, and a maintenance error detection by maintenance error detection unit 126, as described later. Further, the simulation result determination unit 110 performs an optimization of the process parameters by the process parameter adjustment unit 124 as described later. Further, the simulation result determination unit 110 performs an ordering of parts by the parts ordering unit 128 as described later.

While the semiconductor manufacturing apparatus 10 performs a process, the display controller 112 may visualize and display the process state of the semiconductor manufacturing apparatus 10 that is performing the process on, for example, the host computer 22 in real time, by using the virtual process result data and the virtual sensor data obtained from the simulation executed according to the same process parameters as those for the semiconductor manufacturing apparatus 10.

Accordingly, the display controller 112 may implement the so-called digital twin that reproduces changes of the real (physical) space such as the process state of the semiconductor manufacturing apparatus 10 that is performing the process, in a virtual space through a real-time interlocking. In the digital twin, while the semiconductor manufacturing apparatus 10 performs a process, the process state of the semiconductor manufacturing apparatus 10 may be reproduced in real time in the virtual space.

By using the environment of the digital twin, the simulation result determination unit 110 may monitor the process state of the semiconductor manufacturing apparatus 10. Further, the simulation result determination unit 110 may perform, for example, a failure pre-detection, a maintenance time pre-detection, a maintenance error detection, an ordering of parts necessary for a maintenance task, and an adjustment of process parameters, which will be described later.

The simulation model update unit 114 updates the simulation model used by the simulation execution unit 108 for simulating the process state, to a simulation model edited by the analysis server 26.

As described later, the maintenance list management unit 116 specifies a maintenance item from parts that need to be replaced (parts necessary for a maintenance task) as a result of the pre-detection by the simulation result determination unit 110 such as the failure pre-detection or the maintenance time pre-detection. The maintenance list management unit 116 generates a maintenance list including the specified maintenance item. The maintenance list management unit 116 may include, for example, a procedure manual for performing a task of the maintenance item, contents for supporting the task of the maintenance item, information on tools necessary for the task of the maintenance item, in the maintenance list to be generated.

The maintenance list management unit 116 notifies the task management server 36 of the generated maintenance list, to request the task of the maintenance item. Further, the maintenance list management unit 116 may manage the generated maintenance list by storing the list in the maintenance information storage unit 118.

The maintenance list management unit 116 may read and use, for example, the procedure manual for performing the task of the maintenance item, the contents for supporting the task of the maintenance item, and the information on tools necessary for the task of the maintenance item, from the maintenance information storage unit 118. Further, the maintenance list management unit 116 may read and use, for example, the procedure manual for performing the task of the maintenance item, the contents for supporting the task of the maintenance item, and the information on tools necessary for the task of the maintenance item, from the database 106 or a storage device or a server connected to the network 40.

Figure 4:
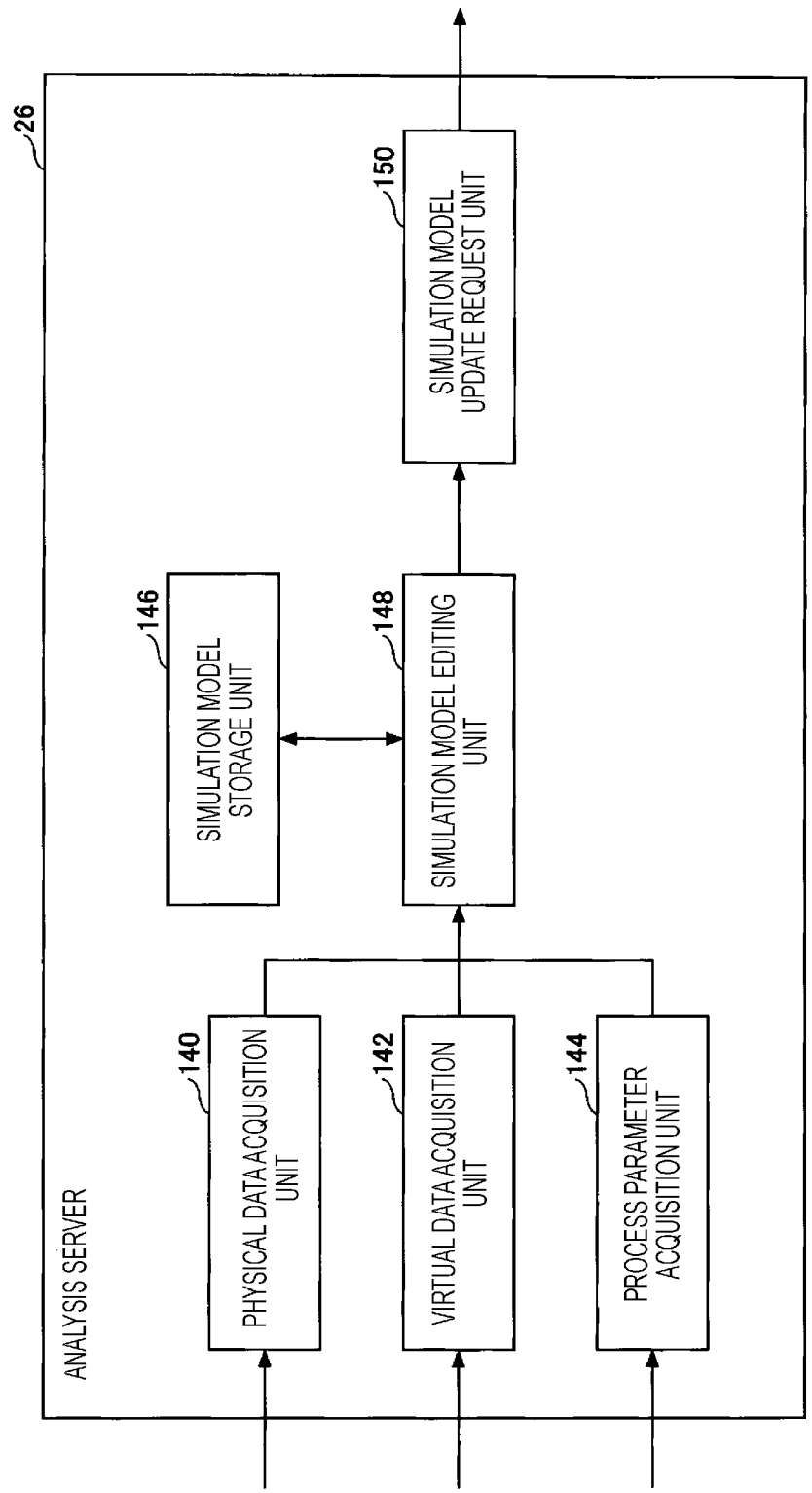
FIG. 4 is a functional block diagram of an example of an analysis server according to the embodiment.

Further, the analysis server 26 of the information processing system 1 according to the present embodiment is implemented by, for example, the functional block of FIG. 4. FIG. 4 is a functional block diagram of an example of the analysis server according to the present embodiment. The functional block diagram of FIG. 4 omits the illustration of a configuration unnecessary for the description of the present embodiment.

By executing programs for the analysis server 26, the analysis server 26 implements a physical data acquisition unit 140, a virtual data acquisition unit 142, a process parameter acquisition unit 144, a simulation model storage unit 146, a simulation model editing unit 148, and a simulation model update request unit 150.

The physical data acquisition unit 140 acquires the physical sensor data and the physical process result data of the semiconductor manufacturing apparatus 10 to be analyzed, from the autonomous control controller 13 or the management server 30 as physical data, and provides the acquired data to the simulation model editing unit 148.

The virtual data acquisition unit 142 acquires the virtual sensor data and the virtual process result data of the semiconductor manufacturing apparatus 10 to be analyzed, from the autonomous control controller 13 or the management server 30 as virtual (cyber) data, and provides the acquired data to the simulation model editing unit 148.

The process parameter acquisition unit 144 acquires the process parameters of the semiconductor manufacturing apparatus 10 to be analyzed, from the autonomous control controller 13 or the management server 30, and provides the acquired data to the simulation model editing unit 148.

The simulation model storage unit 146 stores the simulation model to be used by the simulation execution unit 108 of the autonomous control controller 13 for simulating the process state of the semiconductor manufacturing apparatus 10. By using the provided physical data, virtual data, and process parameters, the simulation model editing unit 148 edits the simulation model to reduce a difference between the physical data and the virtual data for the same process parameters (to make an optimum simulation model) through, for example, a machine learning. The editing of the simulation model may not necessarily be performed during the normal operation of the semiconductor manufacturing apparatus 10, and may be performed, for example, in a case where a physical specification change occurs in the semiconductor manufacturing apparatus 10 to be simulated. The simulation model update request unit 150 requests the autonomous control controller 13 to conduct an update to the edited simulation model.

Figure 5:
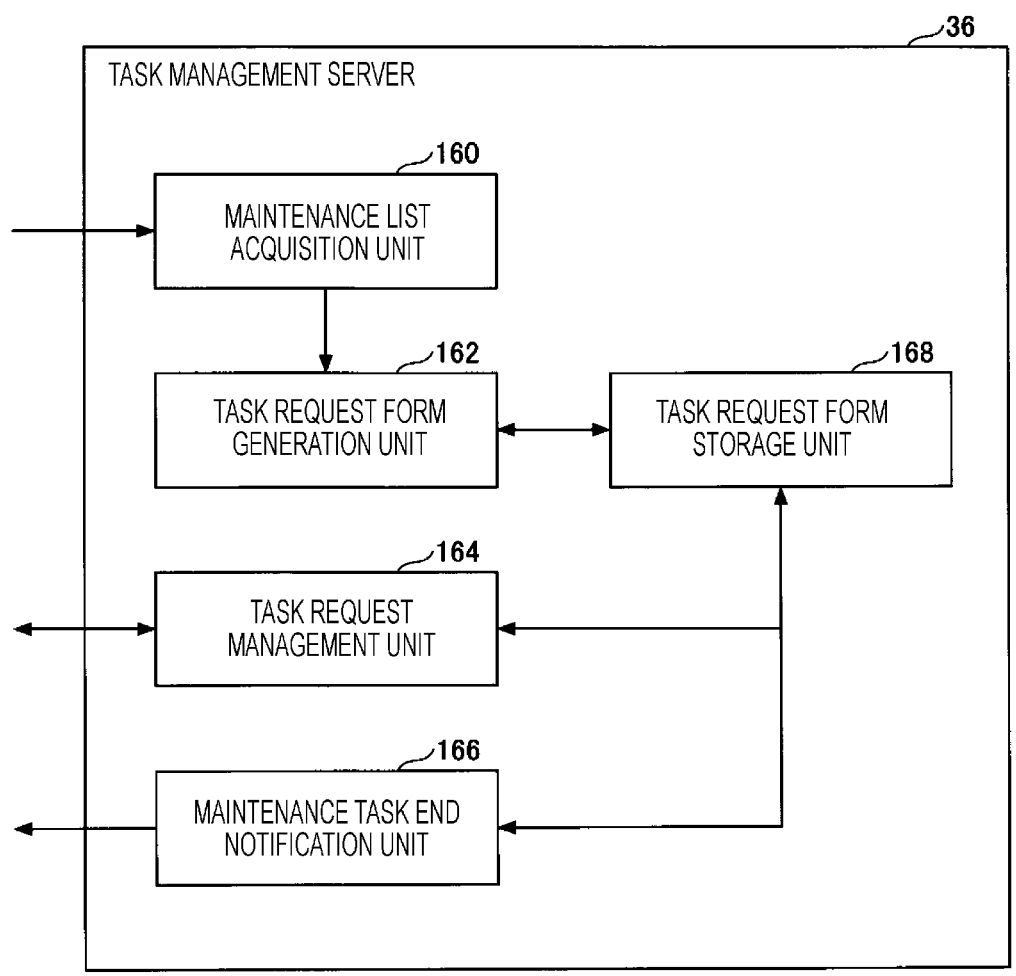
FIG. 5 is a functional block diagram illustrating an example of a task management server according to the embodiment.

Further, the task management server 36 of the information processing system 1 according to the present embodiment is implemented by, for example, the functional block of FIG. 5. FIG. 5 is a functional block diagram of an example of the task management server according to the present embodiment. The functional block diagram of FIG. 5 omits the illustration of a configuration unnecessary for the description of the present embodiment.

By executing programs for the task management server 36, the task management server 36 implements a maintenance list acquisition unit 160, a task request form generation unit 162, a task request management unit 164, a maintenance task end notification unit 166, and a task request form storage unit 168.

The maintenance list acquisition unit 160 acquires the maintenance list notified from the autonomous control controller 13 for requesting the task of the maintenance item. The task request form generation unit 162 generates a task request form by using the maintenance list. The task request form generation unit 162 may include the procedure manual for performing the task of the maintenance item, the contents for supporting the task of the maintenance item, the information on tools necessary for the task of the maintenance item, information on a factory-side person in charge, and information on a factory-side manager, in the task request form to be generated.

Further, the task request form generation unit 162 may include links of the procedure manual for performing the task of the maintenance item, the contents for supporting the task of the maintenance item, the information on tools necessary for the task of the maintenance item, the information on a factory-side person in charge, and the information on a factory-side manager, in the task request form to be generated. The task request form generation unit 162 stores the generated task request form in the task request form storage unit 168.

The task request management unit 164 causes the operator to perform the task of the maintenance item necessary for the semiconductor manufacturing apparatus 10 according to the task request form stored in the task request form storage unit 168. The task request management unit 164 displays the task request form on, for example, the operation terminal operated by the operator, to request the operator to perform the task of the maintenance item necessary for the semiconductor manufacturing apparatus 10.

The process of displaying the task request form on the operation terminal operated by the operator is implemented by using, for example, an application installed in the operation terminal that performs a process in cooperation with the task request management unit 164. Further, for example, the process of displaying the task request form on the operation terminal operated by the operator is implemented using Web contents by causing the task request management unit 164 to function as a Web server and the operation terminal to function as a Web client.

By viewing the task request form displayed on the operation terminal, the operator may check the requested task of the maintenance item necessary for the semiconductor manufacturing apparatus 10. Further, the operator may check, for example, the procedure manual for performing the task of the maintenance item, the contents for supporting the task of the maintenance item, the information on tools necessary for the task of the maintenance item, the information on a factory-side person in charge, and the information on a factory-side manager, which are included the task request form displayed on the operation terminal.

The task request management unit 164 may provide a support button such as a remote support for the maintenance item, in the task request form to be displayed on the operation terminal of the operator, so as to provide a function of starting a communication with the factory-side person in charge or manager when the support button is pressed.

Through the communication with the factory-side person in charge, the operator may receive the support during the task of the maintenance item. Further, an unskilled operator may conduct a review after the end of the task through the communication with the factory-side manger, to receive a confirmation of the task from the skilled operator, so that an error at the maintenance time may be prevented.

Further, the task request management unit 164 provides a task end button for each maintenance item, in the task request form to be displayed on the operation terminal of the operator, and receives the end of the task of the maintenance item from the operator when the task end button is pressed. The task request management unit 164 registers the end of the task of the maintenance item received from the operator in the task request form storage unit 168. The maintenance task end notification unit 166 notifies the autonomous control controller 13 of the end of the task of the maintenance item received from the operator through a maintenance task end notification.

<Process>

<<Preparation>>

The information processing system 1 according to the present embodiment uses a simulation model edited through, for example, a machine learning, to reduce the difference between the physical data of the semiconductor manufacturing apparatus 10 that performs a process according to process parameters and the virtual data of a simulation executed according to the same process parameters as those for the semiconductor manufacturing apparatus 10.

By using the simulation model, the information processing system 1 according to the present embodiment ensures the reliability of simulation results obtained by using the simulation model. The editing of the simulation model may be performed according to, for example, elapsed time from a previous editing, the number of performing times of a process, an increase in difference between the physical data and the virtual data for the same process parameters.

<<Performance of Process>>

Figure 6:
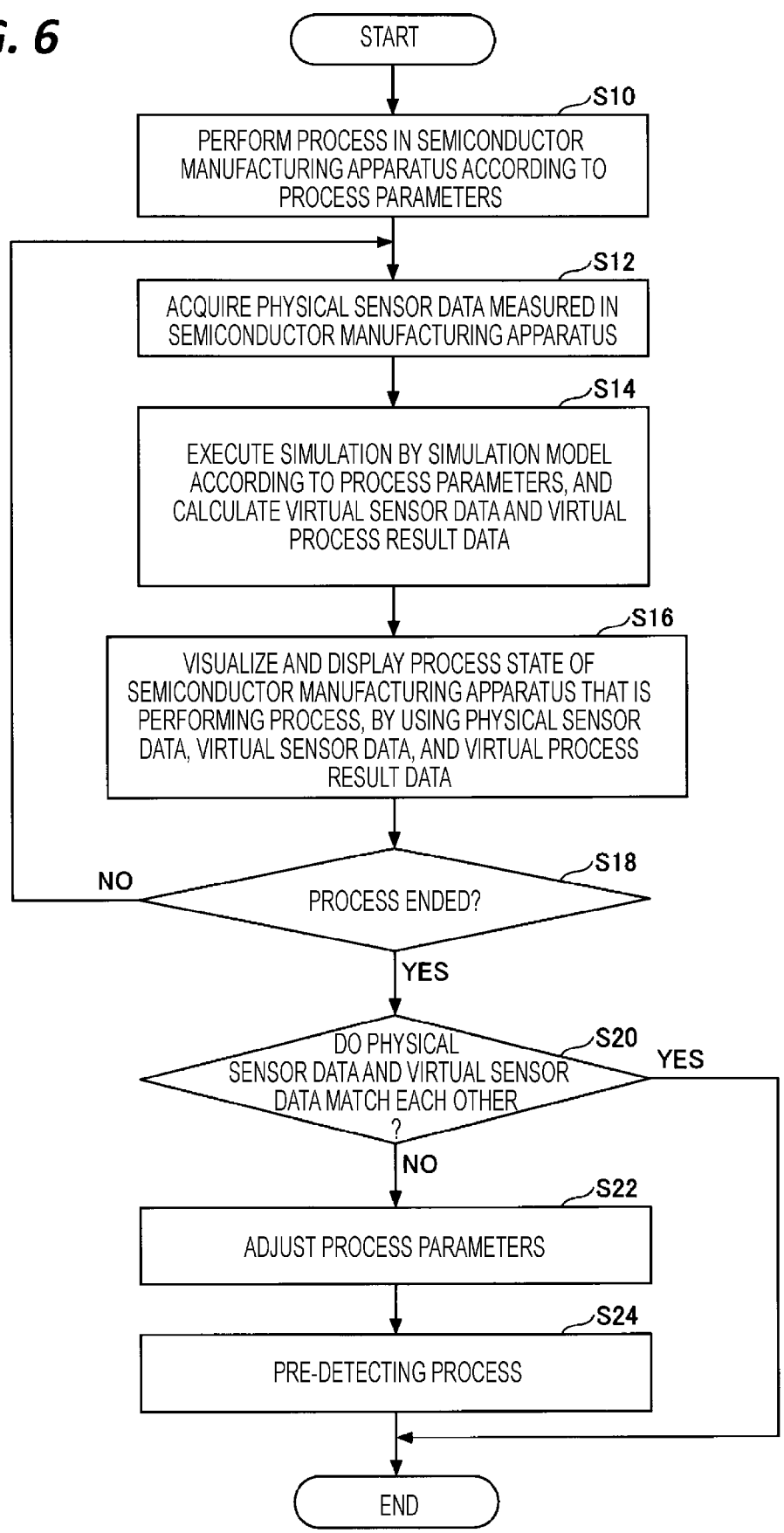
FIG. 6 is a flowchart illustrating an example of a process of the information processing system according to the embodiment.

FIG. 6 is a flowchart illustrating an example of a process of the information processing system according to the present embodiment. The semiconductor manufacturing apparatus 10 performs a process in step S10 according to the process parameters output from the apparatus control controller 20. In step S12, the autonomous control controller 13 acquires the physical sensor data measured by the existing sensors 11 and the additional sensor 12 from the semiconductor manufacturing apparatus 10 that is performing the process.

In step S14, the simulation execution unit 108 of the autonomous control controller 13 executes the simulation by the simulation model according to the same process parameters as those for the semiconductor manufacturing apparatus 10 that is performing the process, and calculates the virtual sensor data and the virtual process result data.

In step S16, the display controller 112 of the autonomous control controller 13 may visualize and display the process state of the semiconductor manufacturing apparatus 10 that is performing the process, on the host computer 22, by using the physical sensor data of the semiconductor manufacturing apparatus 10 that is performing the process, and the virtual process result data and the virtual sensor data obtained from the simulation executed according to the same process parameters as those for the semiconductor manufacturing apparatus 10.

In step S18, the autonomous control controller 13 repeats the processes of steps S12 to S16 until the process that is being performed by the semiconductor manufacturing apparatus 10 is ended. When the process that is being performed by the semiconductor manufacturing apparatus 10 is ended, the process proceeds from step S18 to step S20, and the simulation result determination unit 110 of the autonomous control controller 13 compares the physical sensor data and the virtual sensor data for the same position and time, to determine whether the physical sensor data and the virtual sensor data for the same position and time match each other.

When it is determined that the physical sensor data and the virtual sensor data do not match each other, the simulation result determination unit 110 performs a process parameter adjusting process of step S22 for optimizing the process parameters, so as to obtain customer's desired results after the process is performed.

The process parameter adjusting process of step S22 may be performed in the manner that, for example, when the difference between the physical sensor data and the virtual sensor data for the same position and time exceeds a predetermined threshold value, the optimization of the process parameters is stopped, and the difference is handled through the editing of the simulation model or the maintenance of the semiconductor manufacturing apparatus 10.

The process proceeds to step S24, and the simulation result determination unit 110 performs, for example, the failure pre-detection by the failure pre-detection unit 120 and the maintenance time pre-detection by the maintenance time pre-detection unit 122 as described later. When it is determined that the physical sensor data and the virtual sensor data match each other, the simulation result determination unit 110 skips the process parameter adjusting process of step S22 and the pre-detecting process of step S24.

According to the process of the flowchart of FIG. 6, the optimization of the process parameters may be performed as a measure to obtain the customer's desired results after the process is performed, for example, until the difference between the physical sensor data and the virtual sensor data for the same position and time exceeds the predetermined threshold value.

Meanwhile, when the difference between the physical sensor data and the virtual sensor data for the same position and time exceeds the predetermined threshold value, the measure to obtain the customer's results after the process is performed may be implemented by editing the simulation model or coping with a failure or a maintenance time detected by the pre-detecting process in step S24 (performance of the maintenance).

Figure 7:
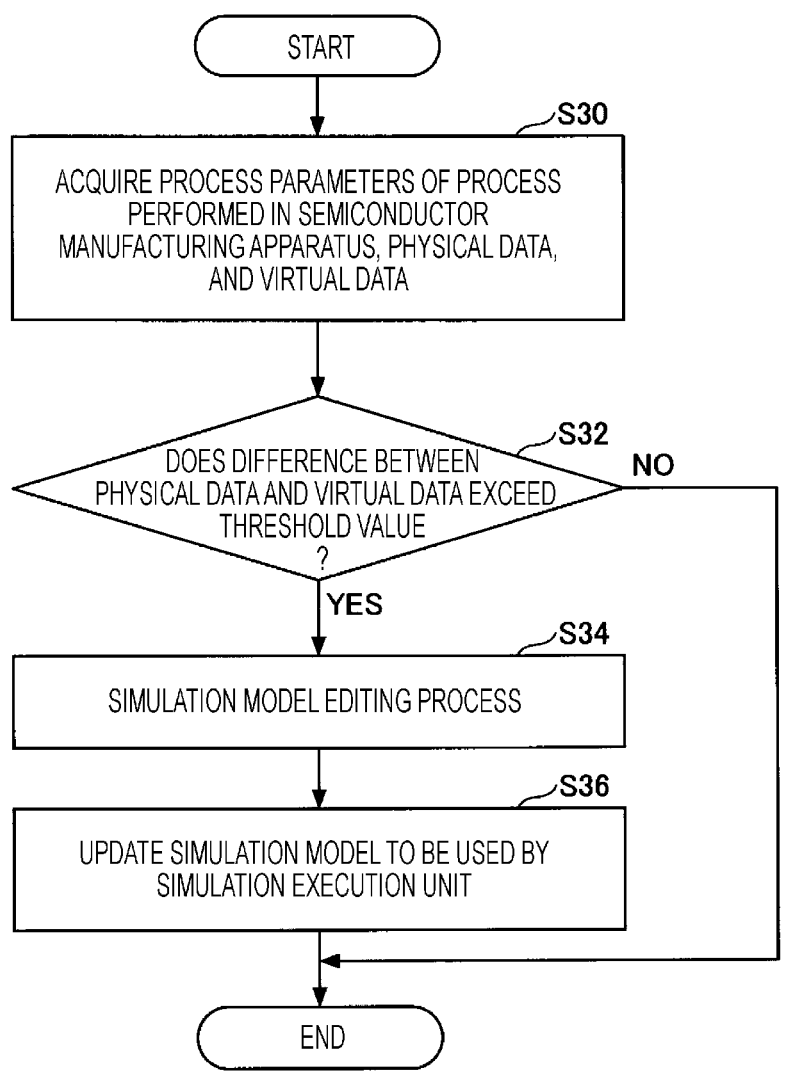
FIG. 7 is a flowchart illustrating an example of a process of editing a simulation model.

The editing of the simulation model is performed by, for example, the process procedure illustrated in FIG. 7. FIG. 7 is a flowchart illustrating an example of the simulation model editing process. In step S30, the analysis server 26 acquires the process parameters of the process performed by the semiconductor manufacturing apparatus 10, the physical data of the semiconductor manufacturing apparatus 10 which are the results of the process according to the process parameters, and the virtual data calculated based on the simulation model.

In step S32, the simulation model editing unit 148 of the analysis server 26 determines whether the difference between the physical sensor data and the virtual sensor data for the same position and time exceeds the predetermined threshold value. When it is determined that the difference does not exceed the predetermined threshold value, the simulation model editing unit 148 skips the processes of steps S34 to S36.

When it is determined that the difference exceeds the predetermined threshold value, the simulation model editing unit 148 performs the editing of the simulation model in step S34 by using the physical data, the virtual data, and the process parameters acquired in step S30 through, for example, a machine learning or a statistical processing, so as to reduce the difference between the physical data and virtual data for the same process parameters.

The process proceeds to step S36, and the simulation model update request unit 150 of the analysis server 26 requests the autonomous control controller 13 to perform an update to the simulation model edited in step S34, so that the simulation model to be used by the simulation execution unit 108 of the autonomous control controller 13 may be updated.

For a base simulation model, the physical data, the virtual data, and the process parameters of a plurality of semiconductor manufacturing apparatuses 10 may be acquired, and the editing of the simulation model may be performed by using, for example, a machine learning or a statistical processing.

Figure 8:
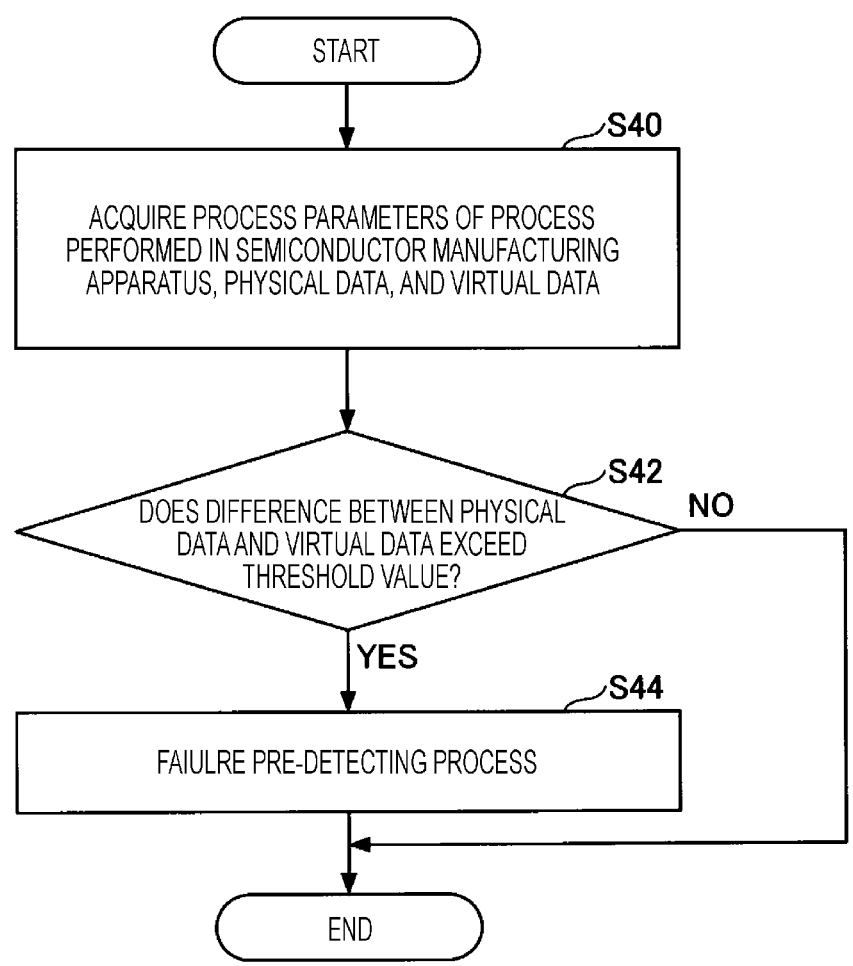
FIG. 8 is a flowchart illustrating an example of a process of performing a failure pre-detection.

Of the pre-detecting processes in step S24 of FIG. 6, the failure pre-detection is performed by, for example, the process procedure illustrated in FIG. 8. FIG. 8 is a flowchart illustrating an example of the failure pre-detecting process.

In step S40, the failure pre-detection unit 120 of the autonomous control controller 13 acquires the process parameters of the process performed by the semiconductor manufacturing apparatus 10, the physical data of the semiconductor manufacturing apparatus 10 which are the results of the process according to the process parameters, and virtual data of the next and subsequent processes calculated based on the simulation model. The virtual data for the next and subsequent processes may be acquired by performing the next and subsequent virtual processes based on the simulation model. The virtual data calculated based on the simulation model may be acquired not only for the next process but also for a plurality of processes in consideration of, for example, a maintenance cycle. In step S42, the failure pre-detection unit 120 determines whether the difference between the physical sensor data and the virtual sensor data for the same position and time exceeds the predetermined threshold value.

When it is determined that the difference does not exceed the predetermined threshold value, the failure pre-detection unit 120 skips the failure pre-detecting process of step S44. When it is determined that the difference exceeds the predetermined threshold value, the failure pre-detection unit 120 pre-detects a failure. The failure pre-detection unit 120 performs the failure pre-detecting process for the pre-detected failure.

As for the failure pre-detecting process, the failure pre-detection unit 120 may search for the type and the cause of the failure from failure determination data, and calculate the number of process performing times or the time period of the process that is available until the manufacturing is affected, from the searched type and cause of the failure and the past failure history. Further, from the searched type and cause of the failure, the failure pre-detection unit 120 may specify parts that need to be replaced (parts necessary for the maintenance task).

Thus, the maintenance list management unit 116 of the autonomous control controller 13 may specify a maintenance item that requires a task, and generate the maintenance list to cope with the failure, at a timing calculated in consideration of the number of process performing times or the time period of the process that is available until the manufacturing is affected.

In the failure pre-detecting process of FIG. 8, the difference between the physical data and the virtual data is determined to be the state prior to the failure. In the simulation by the simulation model, the virtual process result data in which a difference exists between the physical sensor data and the virtual sensor data may be calculated so that the influence of the difference on the process may be determined. Further, by accumulating and checking a deviation for each process, it is possible to determine how many processes are available until the lot-out (until the production is affected).

Further, the information processing system 1 according to the present embodiment may also determine the influence of a portion in a deteriorated state on the process, and may perform an operation to delay the repair time without immediately stopping the manufacturing by the semiconductor manufacturing apparatus 10, depending on the degree of the influence.

In the information processing system 1 according to the present embodiment, the maintenance item that requires a task may be specified in advance from the parts pre-detected to be parts that should (need to) be replaced, so that an unnecessary maintenance may be suppressed, and the operation costs may be reduced.

<<Performance of Maintenance>>

Figure 9:
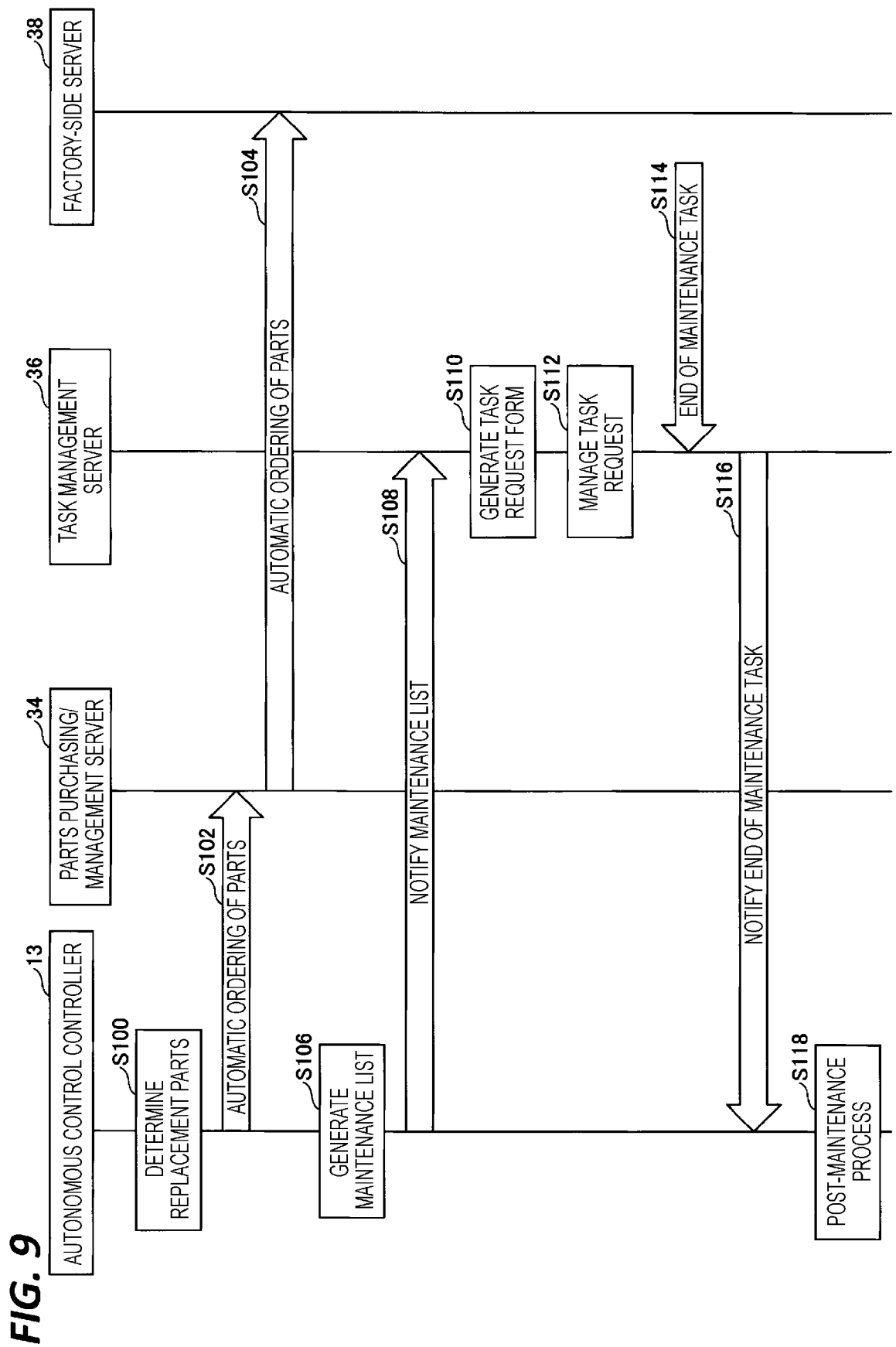
FIG. 9 is a sequence diagram illustrating an example of a maintenance process of the information processing system according to the embodiment.

FIG. 9 is a sequence diagram illustrating an example of the maintenance process of the information processing system according to the present embodiment. The maintenance process of FIG. 9 may be performed, for example, in a case where the parts that need to be replaced are specified in the failure pre-detecting process of step S44 of FIG. 8.

In step S100, for example, the autonomous control controller 13 determines the parts specified as parts that need to be replaced in the failure pre-detecting process of step S44 of FIG. 8, to be replacement parts that will be replaced by the maintenance task. In step S102, the autonomous control controller 13 automatically orders the replacement parts from the parts purchasing/management server 34. The automatic ordering in step S102 may include processes necessary for purchasing the parts, such as an approval process by a person in charge who makes the order or a person in charge who receives the order. In step S104, the parts purchasing/management server 34 automatically orders the replacement parts from the factory-side server 38.

The factory-side server 38 that has received the automatic ordering of the replacement parts from the parts purchasing/management server 34 notifies the information of the replacement parts of the received automatic ordering to a function that performs an inventory management and a function that performs a production management. The factory-side server 38 may notify the information of the replacement parts of the received automatic ordering to an inventory management system and a production management system that perform a process in cooperation.

In the information processing system 1 according to the present embodiment, the information of the replacement parts necessary for the task of the maintenance item of the semiconductor manufacturing apparatus 10 is notified in advance to the factory-side server 38, so that the supply timing of the replacement parts may be brought to an earlier timing.

Further, the information processing system 1 according to the present embodiment collectively manages the information on the ordering of replacement parts from the semiconductor manufacturing apparatuses 10 of multiple customers, so that costs for managing parts may be reduced by analyzing demands for parts through, for example, a machine learning, adjusting a production plan based on predicted demands for replacement parts, and optimizing the inventory management.

In step S106, the autonomous control controller 13 specifies a maintenance item from the replacement parts, and generates the maintenance list including the maintenance item. In step S108, the autonomous control controller 13 notifies the task management server 36 of the generated maintenance list, to request the task of the maintenance item.

In step S110, the task management server 36 generates a task request form by using the maintenance list notified from the autonomous control controller 13. The task request form is generated for requesting the operator to perform the task of the maintenance item. In step S112, the task management server 36 manages the generated task request form, and requests the operator to perform the maintenance task of the task request form. The operator who has received the request performs the task of the maintenance item necessary for the semiconductor manufacturing apparatus 10 according to the contents of the task request form.

The operator may display the task request form on, for example, the operation terminal, to check the requested task of the maintenance item necessary for the semiconductor manufacturing apparatus 10. Further, the operator may check, for example, the procedure manual for performing the task of the maintenance item, the contents for supporting the task of the maintenance item, the information on tools necessary for the task of the maintenance item, the information on a factory-side person in charge, and the information on a factory-side manager, which are included in the task request form displayed on the operation terminal.

For example, since the operator may check the procedure manual for performing the task of the maintenance item and the contents for supporting the task of the maintenance item which are displayed on the operation terminal, the operator may easily receive the support for the maintenance task. The operator may use contents for supporting a task using AR, as an example of the contents for supporting the task of the maintenance item. Further, since the operator may check the information on tools necessary for the task of the maintenance item which is displayed on the operation terminal, the operator may easily prepare the tools necessary for the maintenance.

Further, since the operator may easily start a communication with the factory-side person in charge or the factory-side manager by pressing the support button displayed on the operation terminal, the operator may easily receive the support during the task of the maintenance item through the communication with, for example, the factory-side person in charge. Further, the operator may receive a confirmation of the task from the skilled person by conducting a review after the task is ended, through the communication with the factory-side person in charge, so that an error at the maintenance time may be prevented.

When the task of the maintenance item requested by the task request form is ended, the operator presses, for example, the task end button of the task request form displayed on the operation terminal, and registers the end of the task of the maintenance item in the task management server 36. In step S114, the task management server 36 receives the end of the task of the maintenance item from the operator.

In step S116, the task management server 36 notifies the autonomous control controller 13 of the end of the task of the maintenance item received from the operator through the maintenance task end notification. In step S118, the autonomous control controller 13 performs a post-maintenance process in response to the received maintenance task end notification. In the post-maintenance process, the autonomous control controller 13 updates the maintenance list to bring the state of the maintenance item which is the target of the maintenance task end notification, among the maintenance items included in the maintenance list, into the task ended state. The process of bringing the state of the maintenance item into the task ended state is, for example, a process of deleting the target maintenance item from the maintenance list.

Further, in the post-maintenance process, the process parameters are optimized to the state after the task of the maintenance item is ended (the state where the replacement parts are replaced). Further, in the post-maintenance process, a maintenance error such as an installation mistake of replacement parts or an initial defect is detected as described later.

Figure 10:
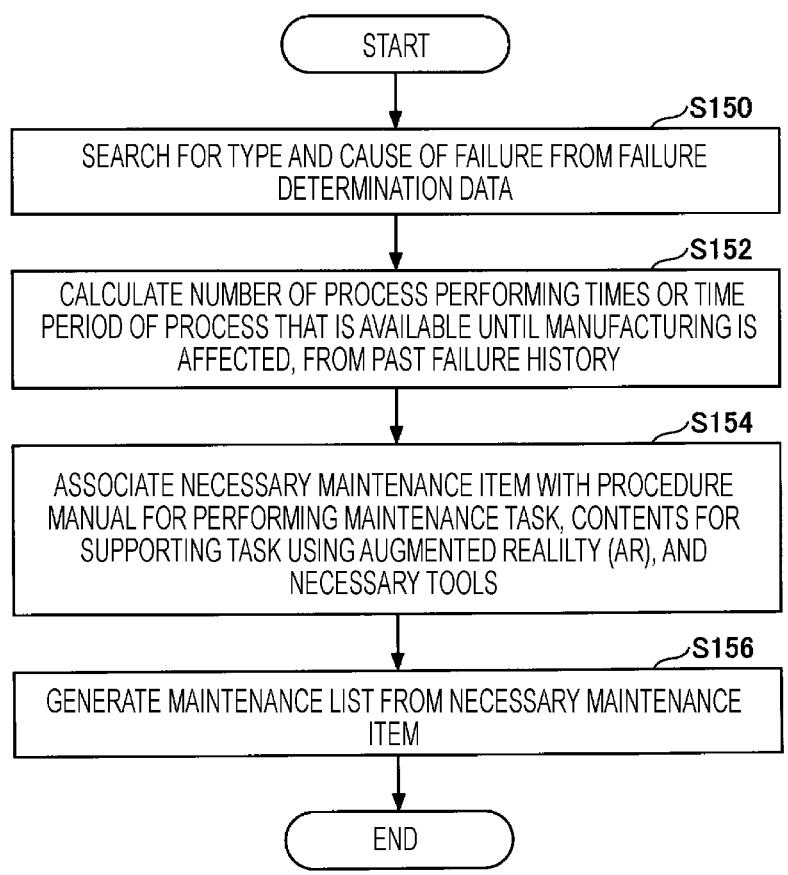
FIG. 10 is a flowchart illustrating an example of a process of generating a maintenance list.

The process of generating the maintenance list in step S106 is performed by, for example, the procedure illustrated in FIG. 10. FIG. 10 is a flowchart illustrating an example of the process of generating the maintenance list.

In step S150, the failure pre-detection unit 120 searches for the type and the cause of the failure from the failure determination data. In step S152, the failure pre-detection unit 120 calculates the number of process performing times or the time period of the process that is available until the manufacturing is affected, from the searched type and cause of the failure and the past failure history. The failure pre-detection unit 120 may adjust the timing for specifying the maintenance item from the parts that need to be replaced, in consideration of the number of process performing times or the time period of the process that is available until the manufacturing is affected.

In step S154, from the replacement parts pre-detected by the failure pre-detection unit 120, the maintenance list management unit 116 specifies a maintenance item which is the target of the maintenance task of the replacement parts, as a necessary maintenance item. Further, the maintenance list management unit 116 performs a process of associating the specified maintenance item with, for example, the procedure manual for performing the task of the specified maintenance item, the contents for supporting the task of the maintenance item through, for example, an augmented reality, and the information on tools necessary for the task of the maintenance item. In step S156, the maintenance list management unit 116 generates the maintenance list including the necessary maintenance item specified in step S154.

Thus, the maintenance list management unit 116 may generate the maintenance list including the maintenance item that requires the maintenance task, and notify the maintenance list to the task management server 36, thereby requesting the task of the maintenance item.

Figure 11:
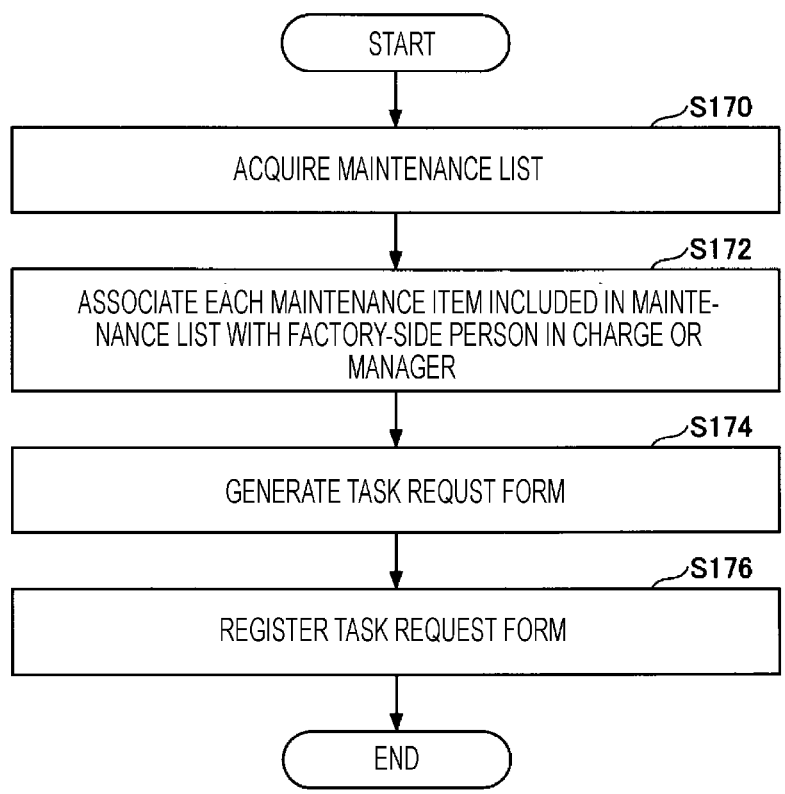
FIG. 11 is a flowchart illustrating an example of a process of generating a task request form.

Further, the process of generating the task request form in step S110 is performed by, for example, the procedure illustrated in FIG. 11. FIG. 11 is a flowchart illustrating an example of the process of generating the task request form.

In step S170, the maintenance list acquisition unit 160 of the task management server 36 acquires the maintenance list notified from the autonomous control controller 13. In step S172, the task request form generation unit 162 performs a process of associating each maintenance item included in the acquired maintenance list with, for example, the information on a factory-side person in charge and the information on a factory-side manager.

The task request form generation unit 162 generates the task request form in step S174, from the maintenance list including the maintenance item associated with, for example, the information on a factory-side person in charge and the information on a factory-side manager in step S172. In step S176, the task request form generation unit 162 registers the generated task request form by storing the task request form in the task request form storage unit 168.

Accordingly, from the maintenance list including the maintenance item necessary for the semiconductor manufacturing apparatus 10, the task management server 36 may generate the task request form to be used for, for example, requesting the operator to perform the maintenance task, supporting the maintenance task performed by the operator, and managing the performance/non-performance of the maintenance task by the operator. The task request form may include information on, for example, price, man-hours, and date and time when the operator performs a task.

Figure 12:
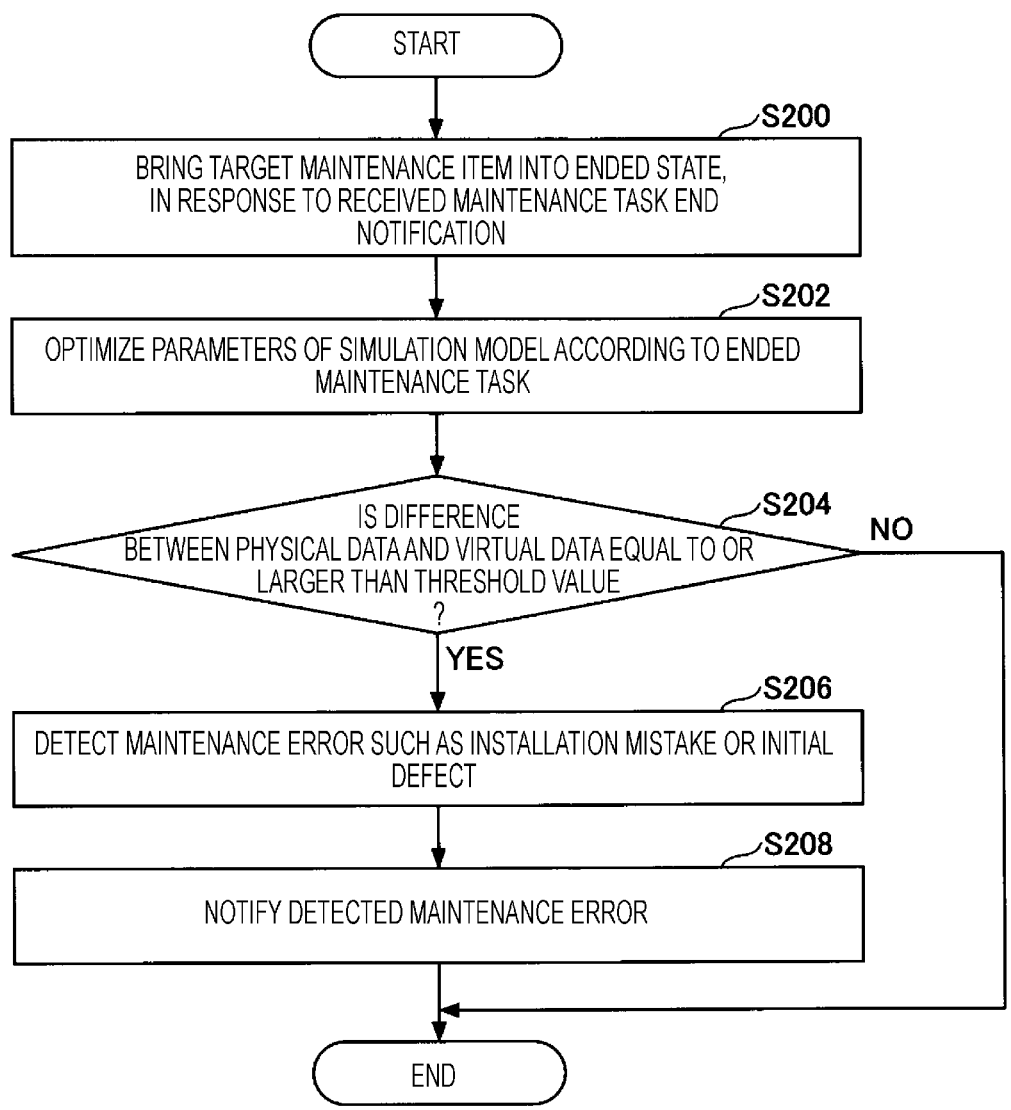
FIG. 12 is a flowchart illustrating an example of a post-maintenance process.

Further, the post-maintenance process performed by the autonomous control controller 13 in step S118 is performed by, for example, the procedure illustrated in FIG. 12. FIG. 12 is a flowchart illustrating an example of the post-maintenance process.

In step S200, in response to the maintenance task end notification received from the task management server 36, the maintenance list management unit 116 updates the maintenance list to bring the state of the maintenance item which is the target of the maintenance task end notification, among the maintenance items included in the maintenance list, into the task ended state.

In step S202, the maintenance list management unit 116 optimizes the process parameters of the simulation model of the simulation execution unit 108 in accordance with the ended maintenance task. Thereafter, the processes of steps S10 to S18 of FIG. 6 are performed. When the process that is being performed by the semiconductor manufacturing apparatus 10 is ended, the process proceeds to step S204, and the maintenance error detection unit 126 of the autonomous control controller 13 compares the physical sensor data and the virtual sensor data for the same position and time, and determines whether the physical sensor data and the virtual sensor data for the same position and time match each other.

When it is determined that the physical sensor data and the virtual sensor data do not match each other, the maintenance error detection unit 126 detects a maintenance error such as an installation mistake or an initial defect. In step S208, the maintenance list management unit 116 notifies the maintenance error detected in step S206 to, for example, the task management server 36.

Accordingly, the task management server 36 may automatically detect a maintenance error or a false report after the end of the task of the maintenance item is received from the operator. Further, when the maintenance error is detected, the autonomous control controller 13 may output an alarm.

SUMMARY

According to the information processing system 1 of the present embodiment, the possibility of a failure of parts may be detected in advance from the difference between the virtual sensor data predicted by the simulation model and the physical sensor data of the process that is being performed, so that it is possible to pre-order the parts that need to be replaced for the maintenance task. Further, a maintenance item to be performed the operator may be specified from the parts that need to be replaced for the maintenance task, and the maintenance list may be automatically generated.

Further, the information necessary for the task of the maintenance item (e.g., the procedure manual for performing the task of the maintenance item, the contents for supporting the task of the maintenance item, and the information on tools necessary for the task of the maintenance item) is associated with the maintenance item included in the maintenance list, so as to support the operator.

Example 1

Hereinafter, an example of a temperature simulation model will be described as an example of the 1D CAE simulation model of the semiconductor manufacturing apparatus 10.

Figure 13:
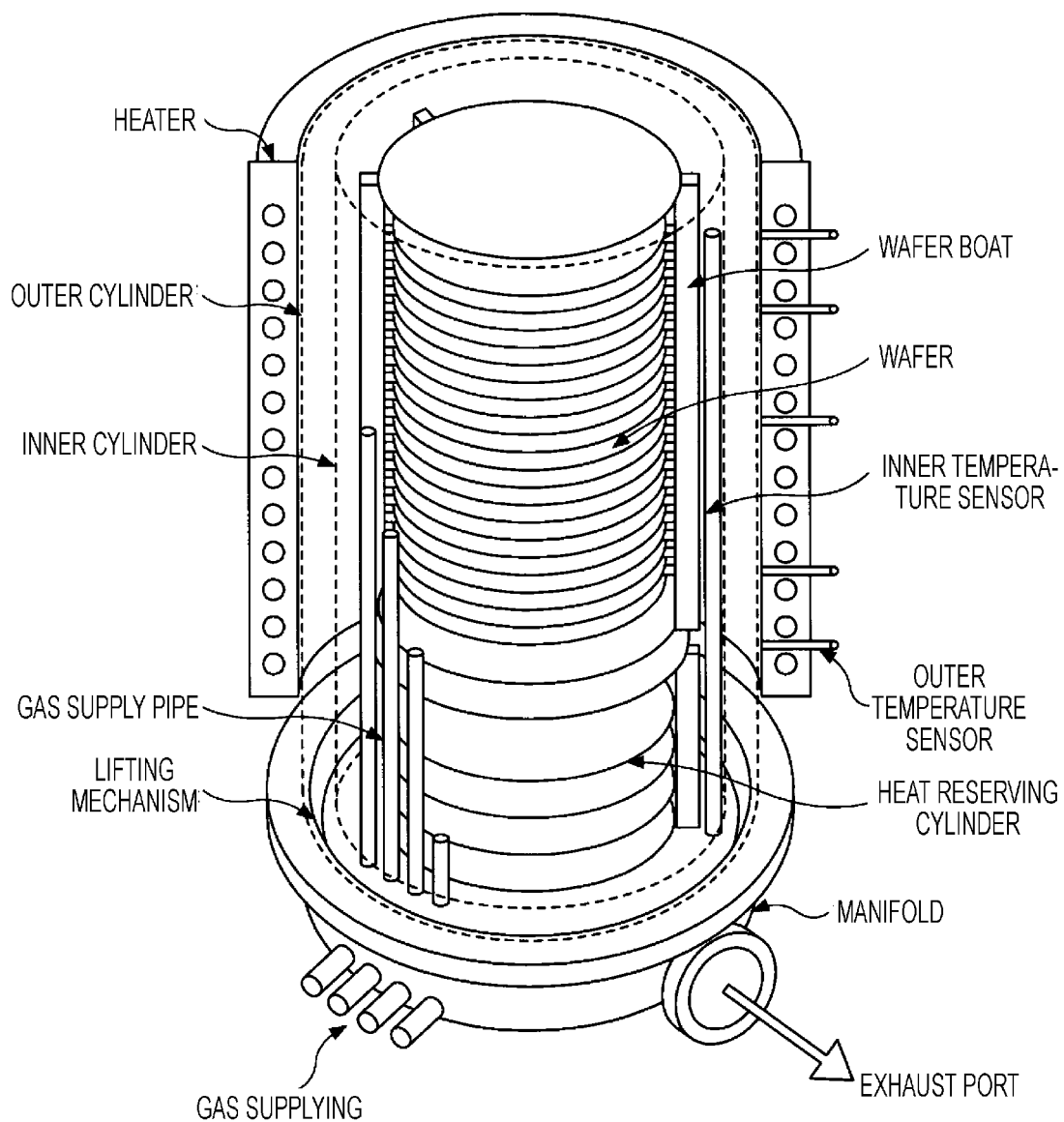
FIG. 13 is a schematic view illustrating an example of a temperature-related portion of a semiconductor manufacturing apparatus.

FIG. 13 is a schematic view illustrating an example of a temperature-related portion of the semiconductor manufacturing apparatus. The semiconductor manufacturing apparatus 10 includes a thermal processing furnace capable of accommodating a plurality of wafers. The thermal processing furnace is a processing container for accommodating and processing wafers. The thermal processing furnace is formed of quartz having a relatively high heat resistance in a substantially cylindrical shape, and has an exhaust port. The thermal processing furnace is configured in a vertical shape that extends in the vertical (up and down) direction. A gas exhaust port is connected to the exhaust port of the thermal processing furnace.

A heater is provided on the side of the thermal processing furnace to surround the thermal processing furnace, and is configured to heat the wafers accommodated in the thermal processing furnace. The lower end of the thermal processing furnace is opened for carrying in/out the wafers. The opening of the lower end of the thermal processing furnace is configured to be opened/closed by a lifting mechanism.

A wafer boat is provided above the lifting mechanism. The wafer boat is a substrate holder that holds the wafers, and is configured to hold the plurality of wafers in multiple stages in a state of being vertically spaced apart from each other.

For example, in the schematic view of FIG. 13, the configuration of the heater, the configuration of the reactor, and the peripheral configuration of the heater are created as the simulation model of 1D CAE, so that a virtual temperature sensor may be constructed based on a power value which is an example of input data to be given to the heater. Further, in order to verify the reliability of the virtual temperature sensor, the physical temperature sensors included in the existing sensors 11 and the additional sensor 12 are used.

For example, examples of the existing sensors 11 include an inner temperature sensor, an outer temperature sensor, a heater ambient temperature sensor, a reactor internal temperature sensor, a gas supply pipe heater temperature sensor, a gas exhaust pipe heater temperature sensor, and a lifting mechanism heater temperature sensor. Further, examples of the additional sensor 12 include a temperature sensor installed in the wafer surface, a temperature sensor installed in the surface of the lifting mechanism that faces a heat reserving cylinder and a reactor, and a gas introduction temperature sensor. The additional sensor 12 is not provided in the finished product to be shipped to customers. The existing sensors 11 are provided in the finished product to be shipped to customers.

Figure 14:
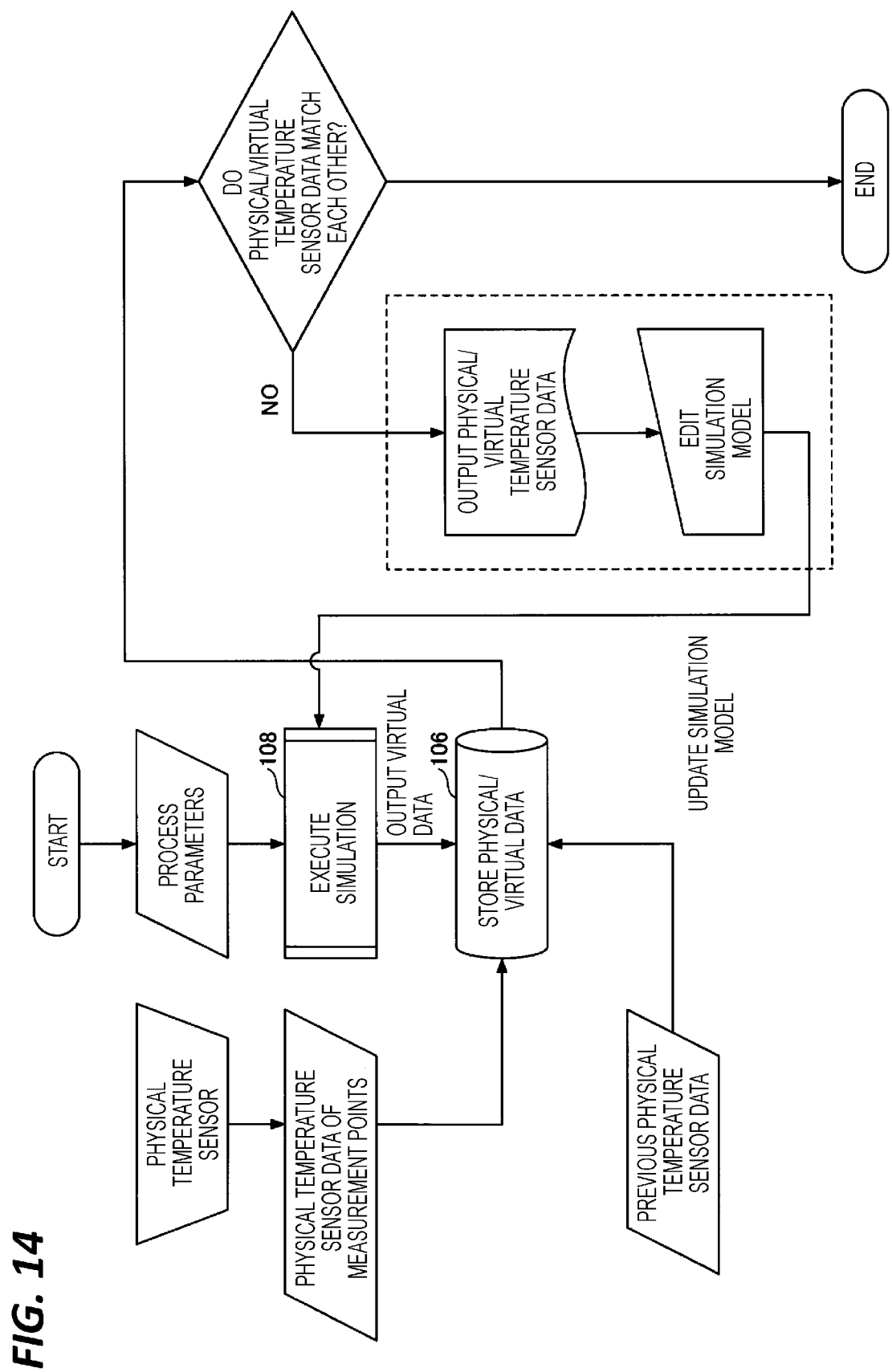
FIG. 14 is a diagram illustrating an example of a process of generating and updating a temperature-related simulation model.

For example, in generating and updating a temperature-related simulation model, the process illustrated in FIG. 14 is performed. FIG. 14 is a diagram illustrating an example of the process of generating and updating the temperature-related simulation model.

The simulation execution unit 108 of the autonomous control controller 13 acquires, for example, the power value of the heater, a set value of a blower, a flow rate and a temperature of a gas, and a lifting position of the wafer boat, as an example of the process parameters of the process that is being performed by the semiconductor manufacturing apparatus 10. The simulation execution unit 108 executes the simulation by the simulation model of the semiconductor manufacturing apparatus 10 according to the process parameters, and outputs the virtual temperature sensor data and the virtual process result data.

Further, the physical temperature sensors which are the existing sensors 11 and the additional sensor 12 measure temperatures of measurement points, and output the temperatures of the measurement points as the physical temperature sensor data of the measurement points. The database 106 stores the output virtual temperature sensor data, virtual process result data, and physical temperature sensor data of the measurement points, and previous physical temperature sensor data.

The simulation result determination unit 110 compares the virtual temperature sensor data and the physical temperature sensor data which are stored in the database 106, for each measurement point, and determines whether the virtual temperature sensor data and the physical temperature sensor data which are stored for the same measurement point in the database 106 match each other.

When it is determined that the data match each other, the simulation result determination unit 110 determines that the virtual temperature sensor data are reliable. When it is determined that the data do not match each other, the simulation result determination unit 110 outputs and records the physical temperature sensor data and the virtual temperature sensor data.

Thereafter, for example, while a data verification is conducted offline, the editing of the simulation model is manually performed to update the simulation model of the simulation execution unit 108.

In this way, in generating and updating the simulation model, the simulation model of the simulation execution unit 108 may be updated as needed while the data verification is conducted offline. In generating and updating the simulation model, an operation to produce the greatest outcome for specification input data may be performed by comparing the virtual data and the physical data, and editing the process parameters according to an algorithm, unless a physical specification change occurs in the target semiconductor manufacturing apparatus 10.

Figure 15:
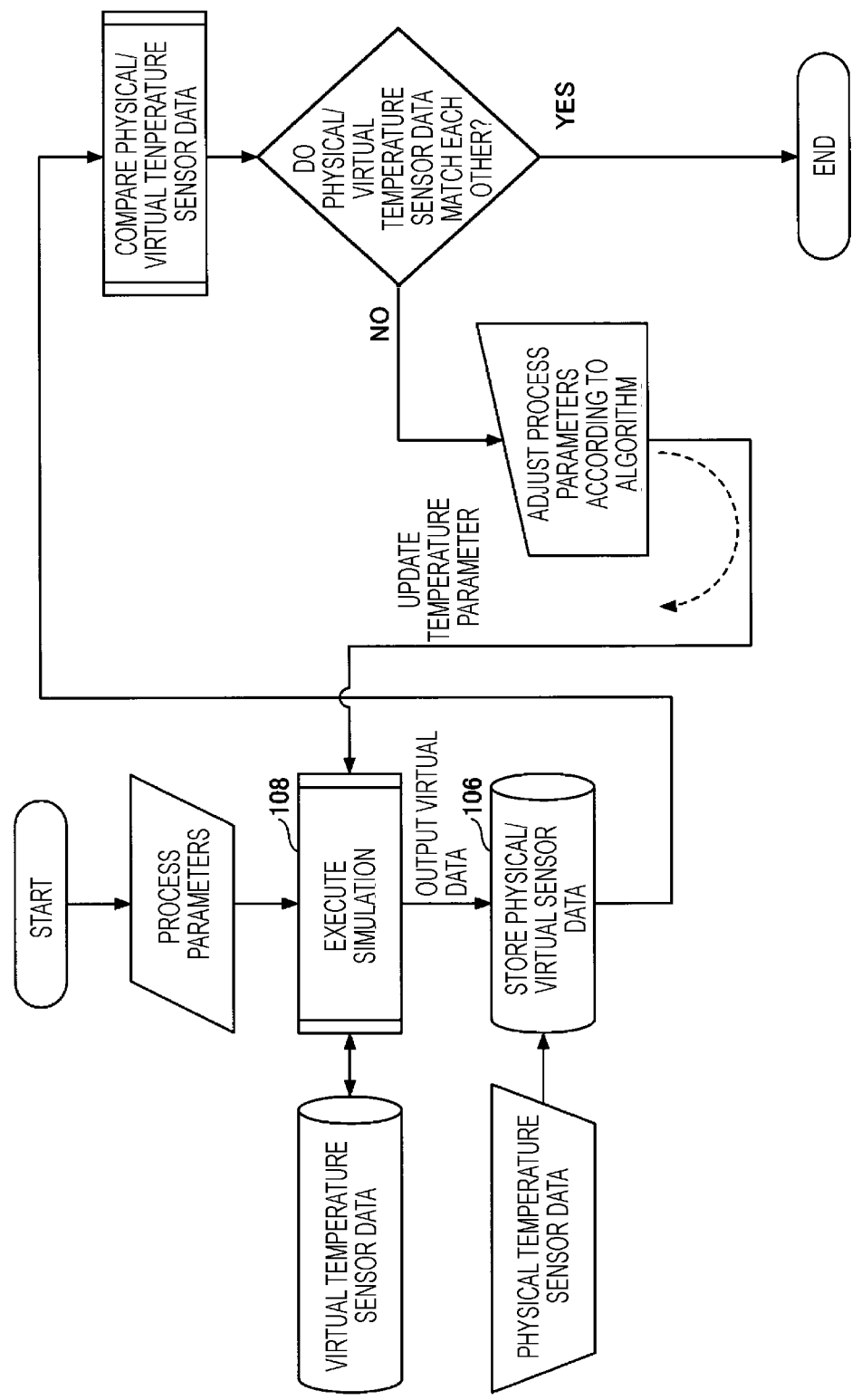
FIG. 15 is a diagram illustrating an example of a process of generating and updating a temperature-related simulation model.

Further, for example, the process illustrated in FIG. 15 may be performed in generating and updating the temperature-related simulation model. FIG. 15 is a diagram illustrating an example of the process of generating and updating the temperature-related simulation model. For example, FIG. 15 represents an example where the process illustrated in FIG. 15 is performed in the phase of a normal operation (during a normal operation), so that the operation is possible by simply adjusting the process parameters as a method other than the updating of the simulation model.

The simulation execution unit 108 of the autonomous control controller 13 acquires the process parameters of the process that is being performed by the semiconductor manufacturing apparatus 10. The simulation execution unit 108 executes the simulation by the simulation model of the semiconductor manufacturing apparatus 10 according to the acquired process parameters, and outputs the virtual sensor data and the virtual process result data.

The existing sensors 11 measure the measurement points, and output the physical sensor data of the measurement points. The database 106 stores the output virtual sensor data, virtual process result data, and physical sensor data of the existing sensors 11. Further, the database 106 stores the virtual sensor data of the additional sensor 12 obtained from the previous simulation, and the virtual sensor data of the additional sensor 12 generated by a statistical analysis result.

The simulation result determination unit 110 compares the virtual sensor data and the physical sensor data of the existing sensors 11, and determines whether the virtual sensor data and the physical sensor data which are stored for the same measurement point in the database 106 match each other. Further, the simulation result determination unit 110 may compare the virtual sensor data of the additional sensor 12 obtained from the previous simulation and the virtual sensor data of the additional sensor 12 generated by the statistical analysis result, and determine whether the virtual sensor data for the same measurement point match each other.

When it is determined that the data do not match each other, the simulation result determination unit 110 adjusts the process parameters according to the algorithm. When the adjustment amount of the adjusted process parameters does not exceed a predetermined threshold value, the simulation execution unit 108 updates the process parameters to the adjusted process parameters, and continues the simulation by the simulation model of the semiconductor manufacturing apparatus 10.

When the adjustment amount of the adjusted process parameters exceeds the threshold value, the simulation execution unit 108 stops the optimization by the adjustment of the process parameters. When it is determined that the virtual sensor data and the physical sensor data which are stored for the same measurement point in the database 106 match each other, the simulation result determination unit 110 determines that the adjustment of the process parameters is unnecessary, and ends the process without adjusting the process parameters.

After the process is ended, when a customer inputs physical process result data such as a film thickness, a sheet resistance, an etching rate, and particle map data, the database 106 stores the physical process result data as the virtual process result data.

In the phase of the normal operation in which the process illustrated in FIG. 15 is performed, an operation to produce the greatest outcome for specification input data is performed by comparing the virtual data and the physical data and editing the process parameters according to the algorithm. Further, in the phase of the normal operation in which the process illustrated in FIG. 15 is performed, a delay of 1 RUN occurs, but the accuracy of the machine learning of the loop indicated by the dashed arrow is improved with the increase in data stored in the database 106, and the accuracy of the prediction control such as the optimal adjustment of the process parameters is improved as the number of times of RUN increases.

The maintenance time pre-detection and the ordering of parts are performed, for example, as illustrated in FIG. 16. FIG. 16 is a diagram illustrating an example of the maintenance time pre-detecting process and the part ordering process. The simulation execution unit 108 of the autonomous control controller 13 acquires the process parameters of the process that is being performed by the semiconductor manufacturing apparatus 10.

The simulation execution unit 108 executes the simulation by the simulation model of the semiconductor manufacturing apparatus 10 according to the acquired process parameters, and outputs the virtual sensor data and the virtual process result data.

The simulation result determination unit 110 compares the virtual sensor data with the physical sensor data of the existing sensors 11, and determines whether the virtual sensor data and the physical sensor data which are stored for the same measurement point in the database 106 match each other. Further, the simulation result determination unit 110 may compare the virtual sensor data of the additional sensor 12 obtained from the previous simulation and the virtual sensor data of the additional sensor 12 generated from a statistical analysis result, and determine whether the virtual sensor data for the same measurement point match each other.

When it is determined that the data match each other, the simulation result determination unit 110 determines that no abnormality exists, and ends the process. When it is determined that the data do not match each other, the simulation result determination unit 110 determines whether the difference between the compared virtual sensor data and physical sensor data exceeds the threshold value.

When it is determined that the difference does not exceed the threshold value, the simulation result determination unit 110 predicts the life according to a life prediction algorithm, and determines whether an alert is necessary. The life prediction algorithm is generated through, for example, a machine learning or statistical analysis software. When it is determined that an alert is unnecessary, the simulation result determination unit 110 ends the process.

When it is determined that an alert is necessary, the simulation result determination unit 110 starts a maintenance time pre-alerting process. When the difference between the compared virtual sensor data and physical sensor data exceeds the threshold value, the simulation result determination unit 110 also starts the maintenance time pre-alerting process.

In the maintenance time pre-alerting process, the simulation result determination unit 110 specifies a part or module that requires an alert. The simulation result determination unit 110 specifies preventive maintenance (PM) information of the specified part or module that requires an alert from, for example, product data or part information. Based on the specified PM information, the simulation result determination unit 110 notifies the maintenance time of the specified part or module that requires an alert. Further, the simulation result determination unit 110 automatically orders the specified part or module that requires an alert. The automatic ordering of the specified part or module that requires an alert may be adjusted according to, for example, the maintenance time.

According to the present disclosure, it is possible to pre-detect and order parts of a semiconductor manufacturing apparatus that need to be replaced, by using a simulation model of the semiconductor manufacturing apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. An information processing apparatus comprising:
a controller configured to control a semiconductor manufacturing apparatus and generate an order for a part of the semiconductor manufacturing apparatus that needs to be replaced, the controller comprising:

a memory; and
a processor coupled to the memory;
a parts purchasing management server configured to receive and notify the order; and
a factory-side server configured to perform an inventory management or a production management of parts based on the order notified from the controller via the parts purchasing management server,
wherein the processor is configured to:
acquire physical sensor data measured in the semiconductor manufacturing apparatus that is performing a process according to process parameters;
execute a simulation of a state of the process by using a simulation model of the semiconductor manufacturing apparatus according to the process parameters, and output virtual sensor data;
based on determination that the physical sensor data and the virtual sensor data do not match each other and a difference between the physical sensor data and the virtual sensor data is equal to or less than a predetermined threshold value greater than 0, adjust the process parameters for optimization; and
based on determination that the difference between the physical sensor data and the virtual sensor data exceeds a predetermined threshold value, stop the process parameter adjustment;
perform a failure pre-detection and a maintenance time pre-detection of the semiconductor manufacturing apparatus based on the difference between the physical sensor data and the virtual sensor data to pre-detect a part of the semiconductor manufacturing apparatus that needs to be replaced;
generate the order for the part of the semiconductor manufacturing apparatus that needs to be replaced, based on a result of the pre-detection, to notify the parts purchasing/management server such that upon receipt of the notification, the parts purchasing/management server orders the part from the factory-side server;
specify a maintenance item necessary for the semiconductor manufacturing apparatus based on the part of the semiconductor manufacturing apparatus that needs to be replaced, based on the result of the pre-detection;
generate a maintenance list by associating the specified maintenance item with at least one of a procedure manual for performing a maintenance task of the maintenance item, contents for supporting the maintenance task of the maintenance item, and information on tools necessary for the maintenance task of the maintenance item;
generate a maintenance task request based on the maintenance list;
in response to a maintenance task end notification to notify of an ended maintenance task of the maintenance item, optimize the process parameters according to the ended maintenance task and acquire the physical sensor data based on the optimized process parameters; and
in response to a specification change, edit the simulation model such that the difference between the physical sensor data and the virtual sensor data is reduced and execute the simulation based on the edited simulation model.

2. The information processing apparatus according to claim 1, wherein the processor is further configured to update the maintenance list to bring a state of a target maintenance item into a task ended state, when the maintenance task end notification is received.

3. The information processing apparatus according to claim 2, wherein the processor is further configured to:
execute the simulation by the simulation model according to the process parameters optimized in a state where the part of the semiconductor manufacturing apparatus is replaced through the task of the maintenance item, and outputs the virtual sensor data, and
detect a task error of the maintenance item including an installation mistake or an initial defect based on the difference between the physical sensor data and the virtual sensor data.

4. The information processing apparatus according to claim 1, wherein the processor is further configured to update the simulation model such that a difference between physical process result data obtained after the process according to the process parameters is performed and virtual process result data calculated by the simulation is reduced, and the difference between the physical sensor data and the virtual sensor data is reduced.

5. The information processing apparatus according to claim 1, wherein the processor is further configured to virtualize and display the state of the process of the semiconductor manufacturing apparatus on a display during a performance of the process, by using the physical sensor data, the virtual sensor data, and virtual process result data calculated by the simulation.

6. The information processing apparatus according to claim 1, wherein performing the failure pre-detection includes:
searching for a type and a cause of failure based on failure determination data; and
calculating a number of process performing times or an available process time period until manufacturing is affected by accumulating a deviation of a difference between physical process result data and virtual process result data for each process based on the searched type and cause of the failure and a past failure history.

7. The information processing apparatus according to claim 1, wherein the processor is further configured to:
acquire physical data including the physical sensor data and physical process result data obtained after the process, the physical sensor data including at least one of a temperature and a pressure measured by the sensor in the semiconductor manufacturing apparatus that is performing the process according to process parameters, the physical process result data including at least one of a film thickness, a sheet resistance, and a particle measured after the process is performed,
execute the simulation to output virtual data including the virtual sensor data and virtual process result data calculated by the simulation, and
the simulation model is edited such that the difference between the physical sensor data and the virtual sensor data is reduced, and a difference between the physical process result data and the virtual process result data is reduced.

8. An information processing system comprising:
a controller configured to control a semiconductor manufacturing apparatus and generate an order for a part of the semiconductor manufacturing apparatus that needs to be replaced, the controller comprising:
a memory; and
a processor coupled to the memory;
a parts purchasing management server configured to receive and notify the order; and
a factory-side server configured to perform an inventory management or a production management of parts based on the order notified from the controller via the parts purchasing management server, wherein the processor is configured to:

acquire physical sensor data measured in the semiconductor manufacturing apparatus that is performing a process according to process parameters;

execute a simulation of a state of the process by using a simulation model of the semiconductor manufacturing apparatus according to the process parameters, and output virtual sensor data;

based on determination that the physical sensor data and the virtual sensor data do not match each other and a difference between the physical sensor data and the virtual sensor data is equal to or less than a predetermined threshold value greater than 0, adjust the process parameters for optimization; and based on determination that the difference between the physical sensor data and the virtual sensor data exceeds the predetermined threshold value, stop the process parameter adjustment;

perform a failure pre-detection and a maintenance time pre-detection of the semiconductor manufacturing apparatus based on the difference between the physical sensor data and the virtual sensor data to pre-detect a part of the semiconductor manufacturing apparatus that needs to be replaced;

generate the order for the part of the semiconductor manufacturing apparatus that needs to be replaced, based on a result of the pre-detection, to notify the parts purchasing/management server such that upon receipt of the notification, the parts purchasing/management server orders the part from the factory-side server;

specify a maintenance item necessary for the semiconductor manufacturing apparatus based on the part of the semiconductor manufacturing apparatus that needs to be replaced, based on the result of the pre-detection;

generate a maintenance list by associating the specified maintenance item with at least one of a procedure manual for performing a maintenance task of the maintenance item, contents for supporting the maintenance task of the maintenance item, and information on tools necessary for the maintenance task of the maintenance item;

generate a maintenance task request based on the maintenance list;

manage the task of the maintenance item in the maintenance list;

in response to a maintenance task end notification to notify of an ended maintenance task of the maintenance item, optimize the process parameters according to the ended maintenance task and acquire the physical sensor data based on the optimized process parameters; and in response to a specification change, edit the simulation model such that the difference between the physical sensor data and the virtual sensor data is reduced and execute the simulation based on the edited simulation model.

9. The information processing system according to claim 8, wherein the processor is further configured to, in the generating the task request:

generate a task request form for requesting the task from an operator, according to the task of the maintenance item necessary for the semiconductor manufacturing apparatus, and set contact information for receiving a support and a confirmation of the task, in the task request form.

10. The information processing system according to claim 9, wherein the processor is further configured to cause a terminal device operated by the operator to display at least one of a procedure manual for performing the task of the maintenance item, contents for supporting the task of the maintenance item, and information on tools necessary for the task of the maintenance item.

11. The information processing system according to claim 8, wherein the processor is further configured to:

analyze a demand for the part of the semiconductor manufacturing apparatus by using information of the order.

* * * * *